United States Patent
Yamamoto et al.

(10) Patent No.: US 9,595,418 B2
(45) Date of Patent: Mar. 14, 2017

(54) ION BEAM IRRADIATION DEVICE

(71) Applicant: ULVAC, INC., Kanagawa (JP)

(72) Inventors: Yoshiaki Yamamoto, Chigasaki (JP);
Young-Doo Kim, Chigasaki (JP);
Yoshinori Obise, Chigasaki (JP);
Satohiro Okayama, Chigasaki (JP)

(73) Assignee: ULVAC, Inc., Kanagawa (JP)

( * ) Notice: Subject to any disclaimer, the term of this patent is extended or adjusted under 35 U.S.C. 154(b) by 0 days.

(21) Appl. No.: 14/377,786

(22) PCT Filed: Feb. 13, 2013

(86) PCT No.: PCT/JP2013/053367
§ 371 (c)(1),
(2) Date: Aug. 8, 2014

(87) PCT Pub. No.: WO2013/122088
PCT Pub. Date: Aug. 22, 2013

(65) Prior Publication Data
US 2015/0179395 A1    Jun. 25, 2015

(30) Foreign Application Priority Data
Feb. 14, 2012  (JP) ................ 2012-029716

(51) Int. Cl.
*H01J 37/317*   (2006.01)
*H01J 37/30*    (2006.01)
(Continued)

(52) U.S. Cl.
CPC .............. *H01J 37/20* (2013.01); *H01J 37/30* (2013.01); *H01J 37/317* (2013.01);
(Continued)

(58) Field of Classification Search
CPC . H01J 37/20; H01J 37/317; H01J 2237/20221
See application file for complete search history.

(56) References Cited

U.S. PATENT DOCUMENTS 5,100,005 A  *  3/1992  Noble et al. ............ 209/583
6,124,599 A  *  9/2000  Muraki .................. 250/492.22
(Continued)

FOREIGN PATENT DOCUMENTS

CN   102099890 A   6/2011
JP   2008-300116 A   12/2008
(Continued)

*Primary Examiner* — Nicole Ippolito
*Assistant Examiner* — Sean Luck
(74) *Attorney, Agent, or Firm* — Christensen Fonder Dardi PLLC

(57) ABSTRACT

An ion beam irradiation device includes a vacuum chamber that accommodates a transport tray which holds a substrate, a transport unit that transports the transport tray in the vacuum chamber in a transport direction, an ion beam irradiation unit that irradiates, with ion beams, a predetermined irradiation position in the vacuum chamber, and a position detector that detects a position of the transport tray. The transport tray includes a plurality of indices that are arranged in the transport direction to indicate portions of the transport tray. The position detector images each of the indices at a predetermined imaging position during transportation of the transport tray and detects a position of the transport tray relative to the imaging position based on the imaged index.

9 Claims, 10 Drawing Sheets

(51) Int. Cl.
*H01J 37/20* (2006.01)
*H01L 21/67* (2006.01)
*H01L 21/677* (2006.01)

(52) U.S. Cl.
CPC .... *H01L 21/6776* (2013.01); *H01L 21/67173* (2013.01); *H01L 21/67213* (2013.01); *H01L 21/67259* (2013.01); *H01L 21/67712* (2013.01); *H01J 2237/20221* (2013.01); *H01J 2237/20292* (2013.01)

(56) References Cited

U.S. PATENT DOCUMENTS

| | | |
|---|---|---|
| 6,360,947 B1 * | 3/2002 | Knowles et al. ......... 235/462.01 |
| 6,371,371 B1 * | 4/2002 | Reichenbach ................ 235/454 |
| 6,753,253 B1 * | 6/2004 | Takahashi et al. ........... 438/676 |
| 2008/0237460 A1 * | 10/2008 | Fragner et al. ............... 250/307 |
| 2008/0315130 A1 | 12/2008 | Watanabe |
| 2009/0189617 A1 * | 7/2009 | Burns et al. .................. 324/649 |
| 2009/0258317 A1 * | 10/2009 | Sunaoshi ..................... 430/296 |
| 2010/0012861 A1 | 1/2010 | Mitchell et al. |
| 2010/0108882 A1 * | 5/2010 | Zewail .......................... 250/307 |
| 2011/0139985 A1 | 6/2011 | Tanimoto et al. |

FOREIGN PATENT DOCUMENTS

| JP | 2009-236784 A | 10/2009 |
|---|---|---|
| JP | 2011-129332 A | 6/2011 |
| JP | 2011-249096 A | 12/2011 |

* cited by examiner

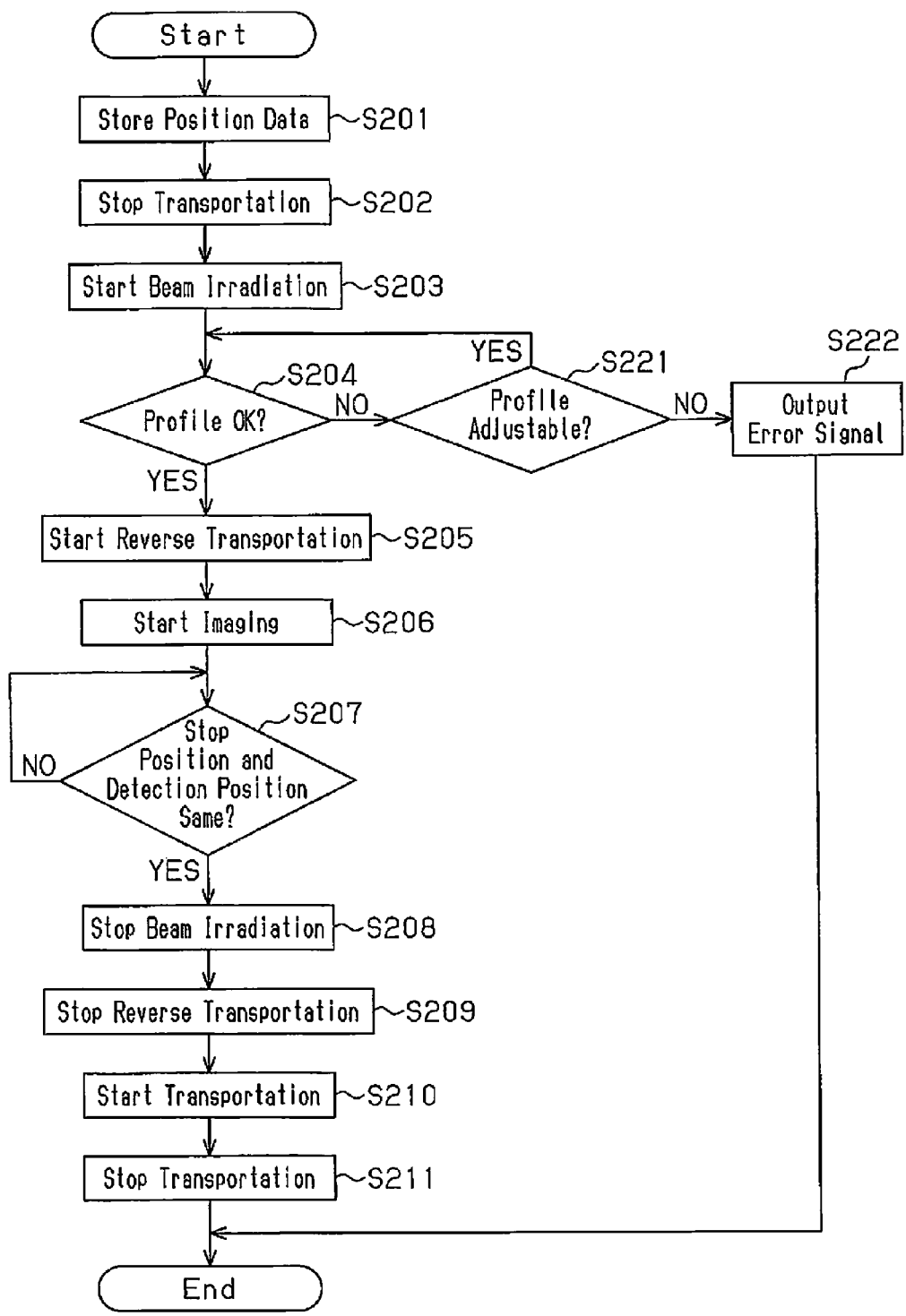

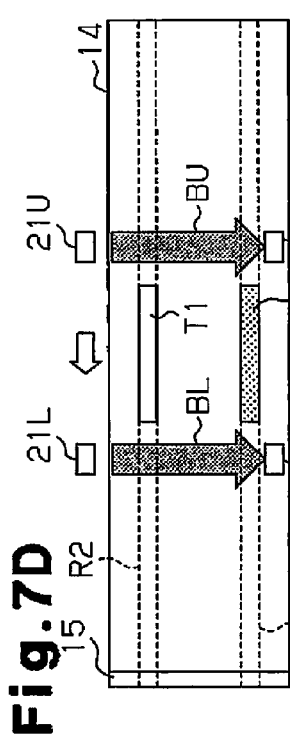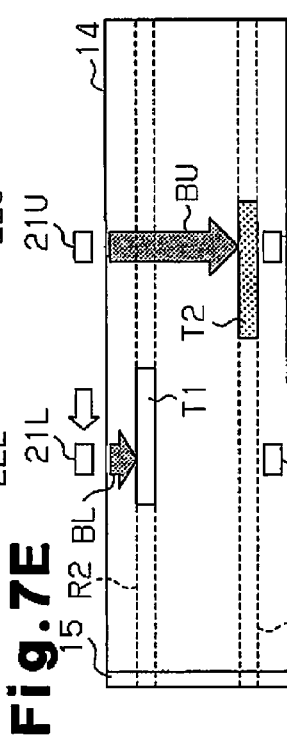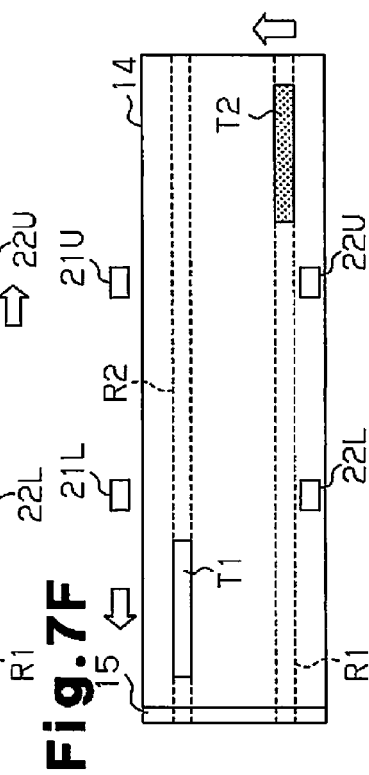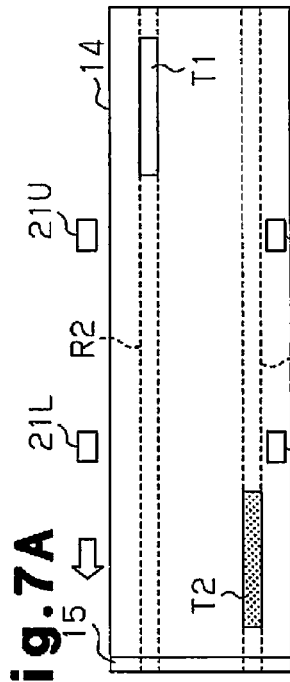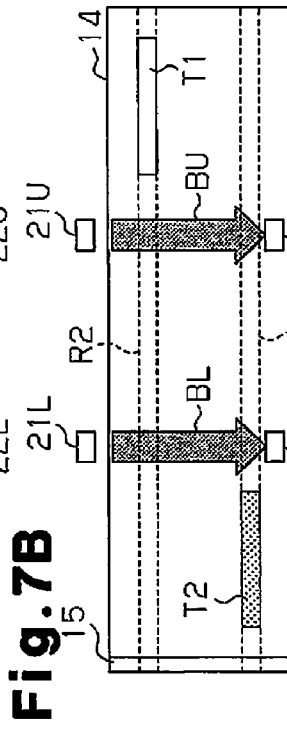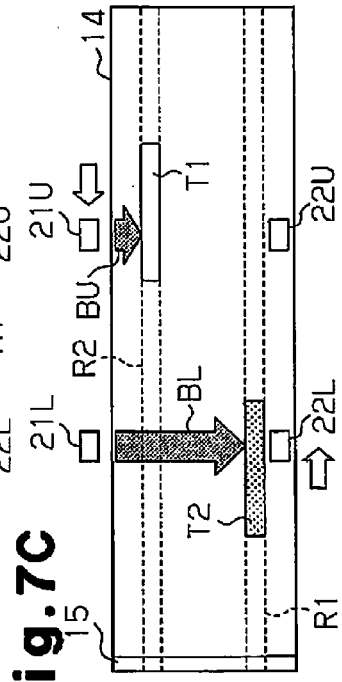

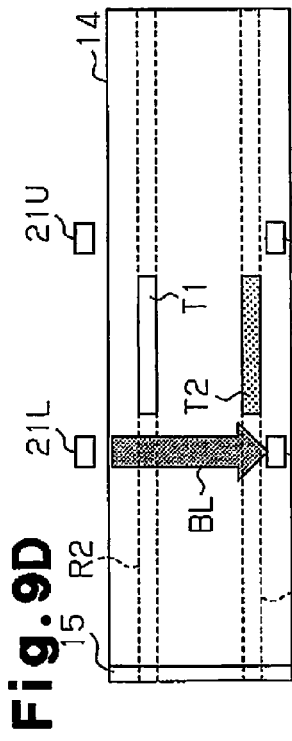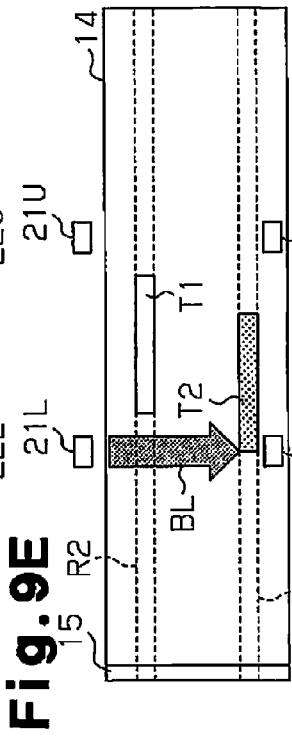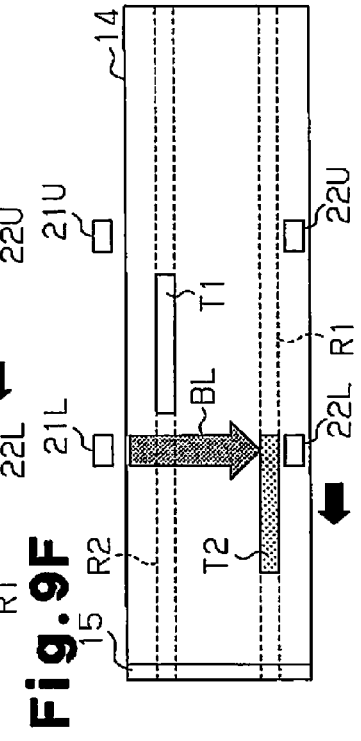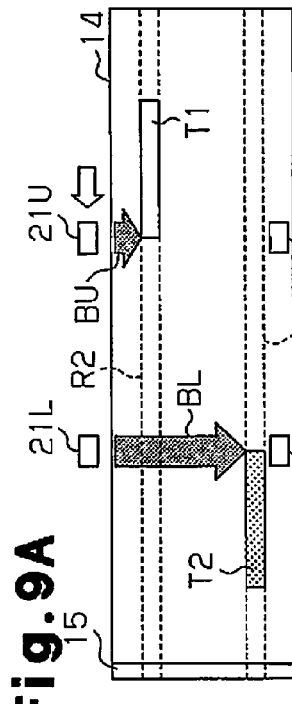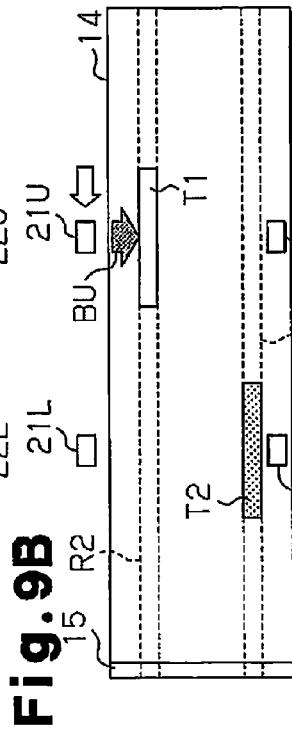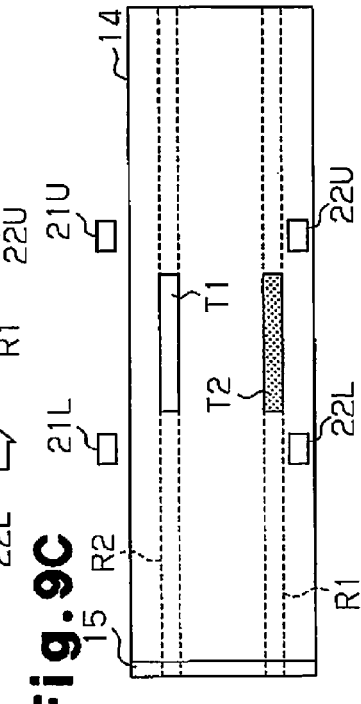

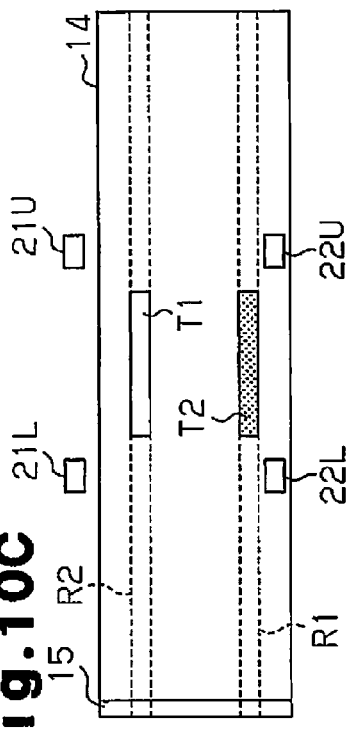
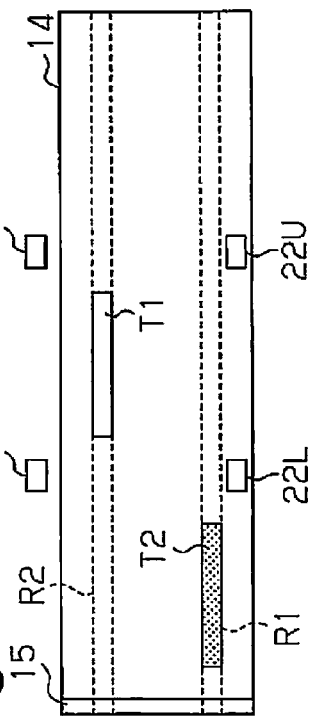
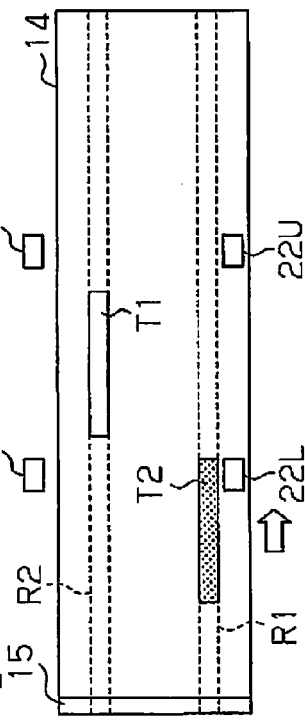

ION BEAM IRRADIATION DEVICE

RELATED APPLICATIONS

The present is a National Phase entry of PCT Application No. PCT/JP2013/053367, filed Feb. 13, 2013, which claims priority from Japanese Patent Application No. 2012-029716, filed Feb. 14, 2012, the disclosures of which are hereby incorporated by reference herein in their entirety.

FIELD OF THE INVENTION

The present invention relates to an ion beam irradiation device that irradiates a variety of substrates, for example, a substrate that forms a large flat panel display (FPD) with ion beams.

BACKGROUND OF THE INVENTION

A large FPD, such as an organic EL display or a liquid crystal panel display, is manufactured through a process for irradiating, with ion beams, a substrate that forms a large FPD. Patent document 1 describes a known example of such a device that performs an irradiation process with ion beams. The device includes a plurality of ion sources and only transports a substrate in a transporting direction so that ion beam irradiation may be performed a number of times. In comparison with a structure that performs ion beam irradiation with a single ion source, this structure allows for versatility in the irradiation characteristics such as the dose and energy of ion beams that irradiates a substrate.

PRIOR ART DOCUMENT

Patent Document 1: Japanese Laid-Open Patent Publication No. 2011-129332

SUMMARY OF THE INVENTION

However, in the ion beam irradiation device described above, due to the enlargement of substrates, the time during which a substrate is irradiated with ion beams often exceeds the time during which the output from an ion source can be maintained. Under such a condition, the output from the ion source may decrease or stop when irradiating a substrate with ion beams. Consequently, the ion beam irradiation amount varies over the plane of the substrate. In this regard, the structure described in patent document 1 allows for measures such as an increase in the number of times a substrate is transported, adjustment of the output from each ion source, or the application of both of these measures. This compensates for the insufficient irradiation amount, that is, this allows for the irradiation amount to be uniform throughout the plane of the substrate.

In a device such as the device described above, generally, a substrate is transported by rotating transport rollers arranged on a transport route, that is, by producing rotation with a motor to rotate the transport rollers. When transporting a substrate in such a manner, to perform repetitive ion beam irradiation when the output from the ion source decreases or stops, there is a need to accurately detect the position irradiated with ion beams for each irradiation so that the irradiation amount becomes uniform throughout the plane. However, in the transport system described above, a transport tray, which supports the substrate, often slips relative to a transport mechanism. Thus, when the substrate position is simply detected from a rotation position of the motor, the detection results of the substrate position may vary.

Unless such detection errors may be reduced, variations in the irradiation amount over the substrate plane cannot be resolved even when any of the measure described above is implemented. Thus, in an ion beam irradiation device, there is a need to detect the ion beam irradiation position on a substrate with higher accuracy.

Accordingly, it is an object of the present invention to provide an ion beam irradiation device that increases the accuracy for detecting an ion beam irradiation position on a substrate.

The means for solving the problem and the advantages of operations will now be described.

In the first aspect of the present invention, an ion beam irradiation device includes a vacuum chamber that accommodates a transport tray which holds a substrate, a transport unit that transports the transport tray in the vacuum chamber in a transport direction, an ion beam irradiation unit that irradiates, with ion beams, a predetermined irradiation position in the vacuum chamber, and a position detector that detects a position of the transport tray. The transport tray includes a plurality of indices that are arranged in the transport direction to indicate portions of the transport tray, and the position detector images each of the indices at a predetermined imaging position during transportation of the transport tray and detects a position of the transport tray relative to the imaging position based on the imaged index.

In the first aspect of the present invention, by imaging each of the indices, each of which indicates the corresponding position of the transport tray, the position of the transport tray relative to the imaging position is detected. The relative relation between the imaging position, where the index is imaged, and the irradiation position, to which ion beams are emitted, is continuously maintained in a predetermined relationship during transportation of the transport tray. Therefore, whenever the position detector detects the index of the transport tray, the position of the transport tray relative to the imaging position, that is, the position of the transport tray relative to the irradiation position is detected. This allows for the position of the transport tray relative to the irradiation position to be directly detected in comparison with when the position of the transport tray is detected from the operation amount of a transport mechanism, which transports the transport tray, or the like. Thus, even when there are differences between the transport mechanism, which transports the transport tray, and the transport tray, errors resulting from such differences would be limited. This increases the accuracy for detecting an irradiation position of the substrate, which is supported by the transport tray.

In the second aspect of the present invention, the ion beam irradiation device includes an output detector that detects an output of ion beams, an acquisition unit that acquires a detection result of the position detector and a detection result of the output detector in a predetermined cycle, and a memory unit that stores the detection result of the position detector and the detection result of the output detector that are obtained by the acquisition unit and associated with each other.

In the second aspect of the present invention, the detection result of the position detector and the detection result of the output detector are associated with each other and stored in the memory. This allows for recognition of the portion of the substrate irradiated with the desirable output of ion beams from information stored in the memory. In other words, the portion of the substrate that is irradiated with an undesirable output of ion beams and the portion of substrate that is not irradiated with ion beams may be recognized. This increases the accuracy of a process performed on a portion of the substrate where the irradiation of ion beams is insufficient to compensate for the insufficient irradiation.

In the third aspect of the present invention, the output detector detects when the output of ion beams stops.

In the third aspect of the present invention, among the irradiation positions of the substrate, the position where the output stops may be recognized. This increases the detection accuracy of the position where the output of ion beams stopped. Therefore, a further irradiation process may be performed with high accuracy on a portion of the substrate that was not irradiated with ion beams.

In the fourth aspect of the present invention, the transport unit transports the transport tray between a starting position of a transport process and a terminal position of the transport process, and the ion beam irradiation device includes a controller that controls transportation of the transport unit. The memory unit stores, as a stop position, the detection result of the position detector that is associated with the stop of the output of ion beams. When the output detector detects the stop of the output of ion beams, the controller drives the transport unit so that the transport tray moves back and forth between the starting position and the terminal position, and the ion beam irradiation unit outputs ion beams, based on the stop position and the detection result of the position detector, to a portion of the substrate that has not been irradiated with ion beams.

As described above, due to the enlargement of substrates, which are subjects of ion beam irradiation, an output of ion beams often stops when the substrate is traversing the irradiation position of ion beams.

In the fourth aspect of the present invention, when detecting that the output of ion beams has been stopped, the position of the transport tray relative to the imaging position is stored in the memory as the stop position associated with the stop of the output. When the position of the transport tray relative to the imaging position is between the stop position and the terminal position, ion beams are output again. Therefore, further irradiation of a portion that has not been irradiated with ion beams may be performed with high accuracy.

In the fifth aspect of the present invention, when the output detector detects the stop of the output of ion beams, the controller transports the transport tray in the transport direction until the position of the transport tray relative to the imaging position reaches a non-irradiation position where the substrate is not irradiated with ion beams and then transports the transport tray, from the non-irradiation position, in a direction opposite to the transport direction. The ion beam irradiation unit resumes ion beam irradiation when the position of the transport tray relative to the imaging position reaches the non-irradiation position, and stops the ion beam irradiation when the position of the transport tray relative to the imaging position reaches the stop position.

In general, an ion beam irradiation unit takes a longer time to adjust output of ion beams to a desirable predetermined value than to intentionally stop the output of ion beams.

In the fifth aspect of the present invention, when detecting that the output of ion beams has been stopped, the position of the transport tray relative to the image position is stored in the memory as the stop position associated with the stopping of the output. After the transport tray is transported to a non-irradiation position, the irradiation of ion beams is started again and the transportation of the transport tray is started in the direction opposite to that of the previous irradiation. When the position of the transport tray relative to the imaging position reaches the stop position, the irradiation of ion beams stops. Therefore, further irradiation of a portion of the substrate S that has not been irradiated with ion beams may be performed with high accuracy.

There are some modes for further irradiation of ion beams that are performed on a portion where the irradiation of ion beams is insufficient. In one mode, the substrate is scanned with ion beams as the transport tray is transported from the stop position in the transport direction. In another mode, the substrate is scanned with ion beams as the transport tray is transported to the stop position in a direction opposite to the transport direction. In the mode in which the transport tray is transported from the stop position in the transport direction, the output of ion beams needs to be resumed before the transport tray is positioned at the stop position. Consequently, at least some positions, which have been irradiated with ion beams, would again be irradiated with ion beams.

In the fifth aspect of the present invention, after the output is stopped, the ion beam irradiation is performed on the transport tray, which is transported in a direction opposite to the transport direction. Thus, the substrate is irradiated with ion beams, of which output is further stably maintained at the set value, compared with when the transport tray is transported from the stop position in the transport direction. This limits variations in the irradiation amount of the substrate from one end through the other end in the transport direction and allows for the irradiation amount to be uniform from one end through the other end of the substrate even when the output of ion beams stops before completion of the irradiation.

In the sixth aspect of the present invention, each of the indices is a barcode. The indices are arranged entirely from one end to the other end of the transport tray in the transport direction.

In the sixth aspect of the present invention, a plurality of barcodes are applied to the transport tray. More specifically, the barcodes are applied to the transport tray entirely from one end to the other end in the transport direction. This aspect allows for the position of the transport tray relative to the imaging position to be obtained entirely from one end to the other end of the transport tray T. Thus, regardless of where the transport tray T is located in the transport direction, the accuracy for detecting the position of the transport tray T may be increased.

In the seventh aspect of the present invention, the ion beam irradiation unit includes an ion source that outputs ion beams. The position detector and the ion source are located at opposite sides of the transport tray.

In the seventh aspect of the present invention, the position detector is located at the side of the transport tray opposite to the ion source. Thus, the indices, which are imaged by the position detector, are located at the same side of the transport tray as the position detector. In this aspect, the indices are located at the side of the transport tray that is not irradiated with ion beams. This limits deterioration in the outer appearance of each index caused by heat or the like of ion beams. Consequently, decreases are limited in the accuracy for detecting the irradiation position of ion beams that would be caused by the deteriorated outer appearance of each index.

In the eighth aspect of the present invention, the position detector is located at a position that does not face the irradiation position of the ion source.

In the eighth aspect of the present invention, the position detector is located at a position that does not face the irradiation position of the ion source. This limits heat deterioration of the imaging mechanism of the position detector. Consequently, decreases are limited in the accuracy for detecting the irradiation position of ion beams that would be caused by the deteriorated outer appearance of each index.

In the ninth aspect of the present invention, the irradiation position of the ion beam irradiation unit is divided, in an intersecting direction that intersects the transport direction, into a first irradiation position and a second irradiation position that contact each other. The ion beam irradiation unit includes a first ion source that irradiates the first irradiation position with ion beams and a second ion source that irradiates the second irradiation position with ion beams.

In the ninth aspect of the present invention, the irradiation position of the ion beam irradiation unit includes the first irradiation position and the second irradiation position. The first irradiation position and the second irradiation position are each irradiated by the different ion sources. Under this situation, the irradiation position is irradiated with ion beams by a plurality of the ion sources. Thus, the ion beam irradiation of the irradiation position may be performed in various manners as compared to when performed with a single ion source. This easily realizes the desirable irradiation amount on the irradiation region.

When the irradiation position of ion beams includes a first irradiation position and a second irradiation position, and if an overlap region in which portions of the irradiation positions are overlapped existed, the irradiation amount of ion beams to the overlap region would be a sum of the irradiation amount from the first ion source and the irradiation amount from the second ion source. Under this situation, when the irradiation position is to be irradiated with a predetermined amount of ion beams, each ion beam irradiation of the first ion source and the second ion source needs to be adjusted in consideration of the ion beam irradiation of the other ion source.

In contrast, in the ninth aspect of the present invention, the first irradiation position and the second irradiation position are located to contact each other. Therefore, there is no need to consider the overlap region described above when the ion beam irradiation of the first ion source and the second ion source is each adjusted. That is, adjustments may be made to the ion beam irradiation of each ion source. This simplifies the ion beam irradiation of the first ion source and the second ion source and improves the throughput of the ion beam irradiation process.

In the tenth aspect of the present invention, each of the indices is a barcode. The transport tray includes two barcode groups, each formed by a plurality of the barcodes. The two barcode groups are arranged so that the first irradiation position and the second irradiation position are located in between in the intersecting direction. The two barcode groups include a first barcode group located at a side of the first irradiation position and a second barcode group located at a side of the second irradiation position. The position detector includes a first position detector and a second position detector. The first position detector is arranged to image the first barcode group at a position facing the first barcode group. The second position detector is arranged to image the second barcode group at a position facing the second barcode group. The ion beam irradiation unit obtains the detection result from the second position detector during output from the first ion source. The ion beam irradiation unit obtains the detection result from the first position detector during output from the second ion source.

In the tenth aspect of the present invention, the transport tray includes the first barcode group and the second barcode group. More specifically, the first barcode group is applied to the first irradiation position side of the transport tray, and the second barcode group is applied to the second irradiation position side of the transport tray. When the first irradiation position is irradiated with ion beams, the second position detector images the first barcode group. When the second irradiation position is irradiated with ion beams, the first position detector images the second barcode group. Thus, ion beams output from the ion beam irradiation unit reach the substrate without being interfered by the position detector. That is, the position detector is not irradiated with ion beams output from the ion beam irradiation unit. Thus, the irradiation of the substrate with ion beams is not interfered. This increases the accuracy for detecting the irradiation position of ion beams.

BRIEF DESCRIPTION OF THE DRAWINGS

FIG. 6 is a flowchart showing the procedures for performing a reverse transport process.

FIGS. 7A to 7F are operation diagrams sequentially showing the movement of transport trays in the ion beam irradiation process.

FIGS. 9A to 9F are operation diagrams sequentially showing the movement of transport trays in the reverse transport process.

FIGS. 10A to 10C are operation diagrams sequentially showing the movement of transport trays in the reverse transport process.

DESCRIPTION OF THE EMBODIMENTS

One embodiment of an ion beam irradiation device according to the present invention will now be described with reference to FIGS. 1 to 10.

Entire Structure of Ion Beam Irradiation Device

First, the entire structure of the ion beam irradiation device will be described with reference to FIG. 1.

Figure 1A:
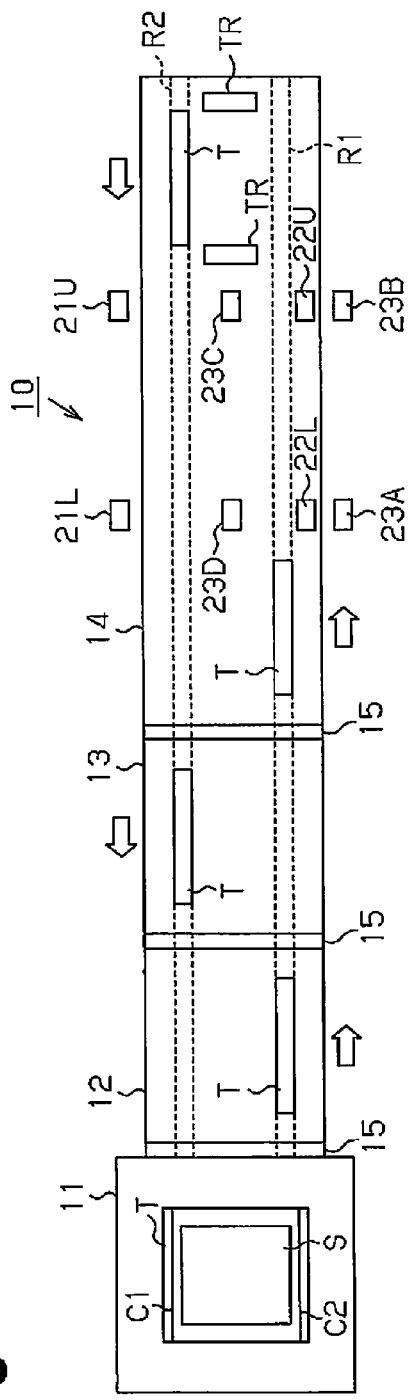
FIG. 1A is a plan view showing the structure of one embodiment of an ion beam irradiation device, in which transport trays accommodated in the structure are indicated by solid lines.

As shown in FIG. 1A, the ion beam irradiation device 10 includes an attachment-removal chamber 11, a load lock chamber 12, a buffer chamber 13, and a processing chamber 14. Each of the chambers 11 to 14 is connected to an adjacent chamber through gate valves 15.

The ion beam irradiation device 10 includes a outgoing line R1, which extends from the attachment-removal chamber 11 to the processing chamber 14, and an incoming line R2, which extends from the processing chamber 14 to the attachment-removal chamber 11. The lines are laid out parallel to each other. A plurality of transport trays T, which have the form of tetragonal plates, are transported along the outgoing line R1 and the incoming line R2.

When a substrate S is received from the outer side, the attachment-removal chamber 11 attaches the substrate S to a transport tray T, which is in a lying position. When sending the transport tray T to the load lock chamber 12, the attachment-removal chamber 11 arranges the transport tray T in an upright position. When the transport tray T is received from the load lock chamber 12, the attachment-removal chamber 11 arranges the transport tray T in the lying position, removes the processed substrate S from the transport tray T, and sends the processed substrate S out of the attachment-removal chamber 11. The attachment-removal chamber 11 attaches and removes the substrate S to and from the transport tray T and changes positions of the transport tray T under atmospheric pressure.

The transport tray T includes upper and lower frames, each of which is parallel to the transport line. When the transport tray T is in an upright position, a group C1 of upper barcodes, each of which indicates a location on the upper frame, is applied to the upper frame, which holds the upper end of the substrate S. Also, a group C2 of lower barcodes, each of which indicates a location on the lower frame, is attached to the lower frame, which holds the lower end of the substrate S. The barcode groups C1 and C2 are respectively applied to the upper frame and the lower frame entirely from one end to the other end in the transport direction. Each of the barcode groups C1 and C2 is, for example, a polyester tape or the like, on which the barcodes are printed (refer to FIG. 3A).

The load lock chamber 12 receives the transport tray T from the attachment-removal chamber 11 along the outgoing line R1 under atmospheric pressure and sends the transport tray T to the buffer chamber 13 along the incoming line R1 under vacuum. Also, the load lock chamber 12 receives the transport tray T from the buffer chamber 13 along the incoming line R2 under vacuum and sends the transport tray T to the attachment-removal chamber 11 along the incoming passage R2 under atmospheric pressure.

The buffer chamber 13, of which internal pressure is reduced to be equivalent to that of the load lock chamber 12, receives the transport tray T from the load lock chamber 12 along the outgoing line R1 and receives the transport tray T from the processing chamber 14 along the incoming line R2.

In the processing chamber 14, the terminal end of the outgoing line R1 includes two switch units TR arranged between the outgoing line R1 and the incoming line R2. When the transport tray T is transported to the proximity of the terminal end of the outgoing line R1, the switch units TR move the transport tray T to the proximity of the starting end of the incoming line R2. In this manner, the switch units TR switch transport lines from the outgoing line R1 to the incoming line R2.

The processing chamber 14 includes two side walls, each of which extends in the direction the chambers 11 to 14 are connected, that is, the transport direction. The side wall located at the side of the incoming line R2 includes a first ion source 21L, which irradiates the inner side of the processing chamber 14 with ion beams. Additionally, the portion of the side wall toward the starting end of the incoming line R2 from the first ion source 21L includes a second ion source 21U, which irradiates the inner side of the processing chamber 14 with ion beams. The first ion source 21L and the second ion source 21U are spaced apart, for example, by a distance corresponding to the width of the transport tray T in the transport direction. The first ion source 21L is arranged at a lower side of the side wall, and the second ion source 21U is arranged at an upper side of the side wall.

Hereinafter, in the processing chamber 14, the direction in which the transport tray T is transported in order of ion beam irradiation processing will be referred to as the forward direction. In contrast, the direction in which the transport tray T is transported opposite to the ion beam irradiation processing will be referred to as the reverse direction. That is, when the transport tray T is transported on the outgoing line R1, the transport tray T moves away from the buffer chamber 13 when transported in the forward direction. In contrast, when the transport tray T is transported on the incoming line R2, the transport tray T moves toward the buffer chamber 13 when transported in the forward direction. Thus, in each of the above situations, when transported in the opposite direction, the transport tray T is transported in the reverse direction. The white arrows in FIG. 1 indicate transportation in the forward direction.

The first ion source 21L irradiates, with ion beams, a predetermined first irradiation position in the processing chamber 14, which is a vacuum chamber. This irradiates, with ion beams, a lower region SL, which is the lower half, of the substrate arranged in the transport tray T when transported by the transport tray T. The second ion source 21U irradiates, with ion beams, a predetermined second irradiation position in the processing chamber 14. This irradiates, with ion beams, an upper region SU, which is the upper half, of the substrate S when transported by the transport tray T. Each ion source 21L and 21U irradiates, with ion beams, the substrate S set on the transport tray T transported on the outgoing line R1 and the substrate S set on the transport tray T transported on the incoming line R2. More specifically, each of the ion sources 21L and 21U irradiates, twice with ion beams, the same substrate S, which is set on the same transport tray T, at different portions and different timings. Further, the ion sources 21L and 21U irradiate, with ion beams, the transport tray T that is being transported. Thus, portions of the substrate S irradiated with ion beams relatively move in the transport direction of the transport tray T.

As described above, the substrate S includes the upper region SU and the lower region SL, and each of the ion sources 21L and 21U irradiates each of the upper region SU and the lower region SL twice at different timings. Thus, the ion beam irradiation of the substrate S may be performed in various manners as compared to conditions in which the ion beam irradiation is performed on the substrate S from a single ion source or when the ion beam irradiation is performed on each region SU and SL only once. This easily realizes the desirable irradiation amount on the substrate surface. The regions SU and SL are arranged next to each other and irradiated with ion beams from different ion sources 21L and 21U. Thus, adjustments may be made to the ion beam irradiation of each ion source 21L and 21U. This simplifies ion beam irradiation from each ion source 21L and 21U as compared to a structure in which the regions of the ion beam irradiation overlap. This improves the throughput of the ion beam irradiation process.

To simplify the drawings, the ion sources 21L and 21U are shown at locations separated from the processing chamber 14. Actually, each ion source 21L and 21U is arranged outside the processing chamber 14 and connected to the processing chamber 14 through a transmission passage, through which ion beams are transmitted.

The processing chamber 14 includes a first profile measurement unit 22L, which measures the ion beam output from the first ion source 21L, at a position opposing the first ion source 21L. The outgoing line R1 and the incoming line R2 are arranged between the first profile measurement unit 22L and the first ion source 21L as viewed from above. Also, the processing chamber 14 includes a second profile measurement unit 22U, which measures the ion beam output from the second ion source 21U, at a position opposing the second ion source 21U. The outgoing line R1 and the incoming line R2 are arranged between the second profile measurement unit 22U and the second ion source 21U as viewed from above. The first profile measurement unit 22L and the second profile measurement unit 22U measure the detected ion beam profiles, for example, the beam output distribution.

The processing chamber 14 includes a first barcode reader 23A, which reads each of the barcodes in the upper barcode group C1 and is arranged along the side wall, which extends in the direction the chambers 11 to 14 are connected, at the side of the outgoing line R1. The first barcode reader 23A images a barcode at an imaging position where the first ion source 21L and the first irradiation position of the first ion source 21L are aligned along a straight line as viewed from above. When the transport tray T on the outgoing line R1 reaches the first irradiation position, the first barcode reader 23A detects one end of the upper barcode group C1 at the imaging position. In this manner, the first barcode reader 23A forms a second position detector, which images a barcode of the transport tray T on the outgoing line R1 at a predetermined imaging position in the processing chamber 14.

Also, the processing chamber 14 includes a second barcode reader 23B, which reads each of the barcodes in the lower group C2 and is arranged at the terminal end of the outgoing line R1 from the first barcode reader 23A along the above-mentioned side wall. The second barcode reader 23B images a barcode at an imaging position where the second ion source 21U and the second irradiation position of the second ion source 21U are aligned along a straight line as viewed from above. When the transport tray T on the outgoing line R1 reaches the second irradiation position, the second barcode reader 23A detects one end of the lower barcode group C2 at the imaging position. In this manner, the second barcode reader 23B forms a first position detector, which images a barcode of the transport tray T on the outgoing line R1 at a predetermined imaging position in the processing chamber 14.

To simplify the drawings, each barcode reader 23A and 23B is shown at a location separated from the processing chamber 14. Actually, the first barcode reader 23A is arranged outside a top wall of the processing chamber 14 along the inner side of the side wall, and the second barcode reader 23B is arranged outside a bottom wall of the processing chamber 14 along the inner side of the side wall.

Additionally, in the processing chamber 14, a third barcode reader 23C, which reads each of the barcodes in the lower barcode group C2, is arranged in a region between the outgoing line R1 and the incoming line R2 as viewed from above. The third barcode reader 23C images a barcode at an imaging position where the second ion source 21U and the second irradiation position of the second ion source 21U are aligned along a straight line as viewed from above. When the transport tray T on the incoming line R2 reaches the second irradiation position, the third barcode reader 23C detects one end of the lower barcode group C2 at the imaging position. In this manner, the third barcode reader 23C includes a first position detector, which images a barcode of the transport tray T on the incoming line R2 at a predetermined imaging position in the processing chamber 14.

Additionally, in the processing chamber 14, a fourth barcode reader 23D, which reads each of the barcodes in upper barcode group C1, is arranged at the terminal end of the incoming line R2 in a region between the outgoing line R1 and the incoming line R2 as viewed from above. The fourth barcode reader 23D images a barcode at an imaging position where the first ion source 21L and the first irradiation position of the first ion source 21L are aligned along a straight line as viewed from above. When the transport tray T in the incoming line R2 reaches the first irradiation position, the fourth barcode reader 23D detects one end of the upper barcode group C1 at the imaging position. In this manner, the fourth barcode reader 23D includes a second position detector, which images a barcode of the transport tray T in the incoming line R2 at a predetermined imaging position in the processing chamber 14.

The third barcode reader 23C, in the same manner as the second barcode reader 23B, is arranged outside the bottom wall of the processing chamber 14, and the fourth barcode reader 23D, in the same manner as the first barcode reader 23A, is arranged in outside the top wall of the processing chamber 14.

Figure 1B:
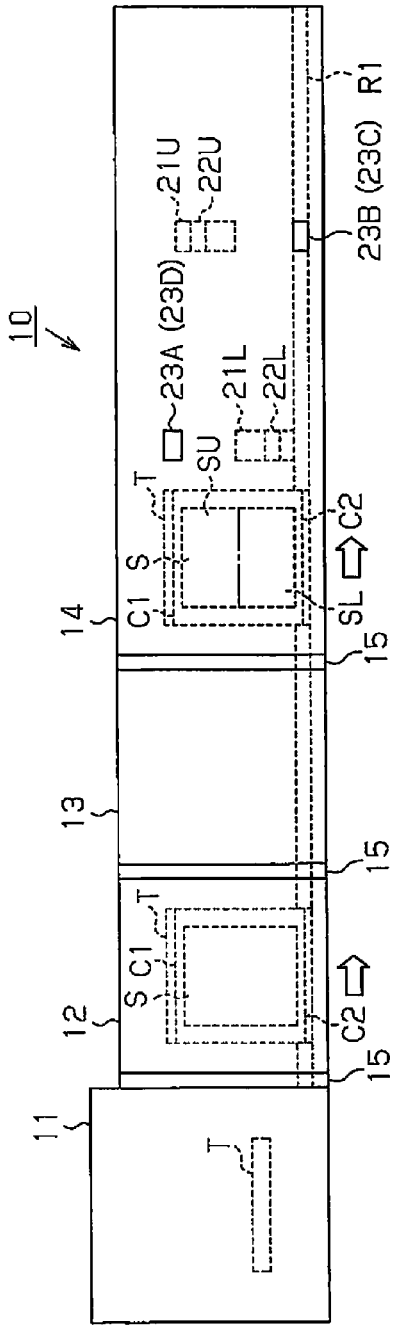
FIG. 1B is a schematic side view showing the structure of the embodiment, in which the transport trays accommodated in the structure are indicated by dashed lines.

In detail, as shown in FIG. 1B, among the two regions dividing the substrate S in the heightwise direction, which is perpendicular to the transport direction, the irradiation position of the first ion source 21L entirely covers the lower region SL of the substrate S. The first profile measurement unit 22L, which detects an ion beam, is arranged at a position facing the first irradiation position. In contrast, among the two regions, the second irradiation position of the second ion source 21U entirely covers the upper region SU. The second profile measurement unit 22U, which detects an ion beam, is arranged at a position facing the second irradiation position.

As described above, the transport tray T includes the barcode groups C1 and C2, each of which includes a plurality of barcodes and continuously extends from the front end to the back end of the transport tray T in the transport direction, for example, the forward direction. Thus, a position, corresponding to the transport direction, of the transport tray T from one end to the other is obtained by each of the readers 23A to 23D. This allows for any position corresponding to an imaging position of the transport tray T, which is transported in the forward direction and the reverse direction, to be directly obtained. Thus, the accuracy for position detection of the transport tray T is increased.

The transport tray T includes the upper barcode group C2, which serves as the second barcode group arranged in the upper region SU of the substrate S, and the lower barcode group C1, which serves as the first barcode group arranged in the lower region SL of the substrate S. When the upper region SU is irradiated with ion beams, the second barcode reader 23B and the third barcode reader 23C, each of which serves as the first position detector, read the lower barcode group C2. In contrast, when the lower region SL is irradiated with ion beams, the first barcode reader 23A and the fourth barcode reader 23D, each of which serves as the second position detector, read the upper barcode group C1. Thus, ion beams, which are output from the ion sources 21L and 21U, reach the substrate S without being interfered by the barcode readers 23A to 23D. This controls output variations over the irradiation region of ion beams, which reach the substrate S. Also, the barcode readers 23A to 23D are not irradiated with ion beams. This limits deterioration of the barcode readers 23A to 23D caused by heat or the like of ion beams.

The processing chamber 14, of which internal pressure is decreased to less than that of the buffer chamber 13, receives the transport tray T along the outgoing line R1 and irradiates the substrate S set on the transport tray T with ion beams. Also, the processing chamber 14 transports the transport tray T from the outgoing line R1 to the incoming line R2. The processing chamber 14 irradiates the substrate S, which is set on the transport tray T, with ion beams and then sends the transport tray T to the buffer chamber 13 along the incoming line R2.

Detail Structure of Transport Tray

Figure 2:
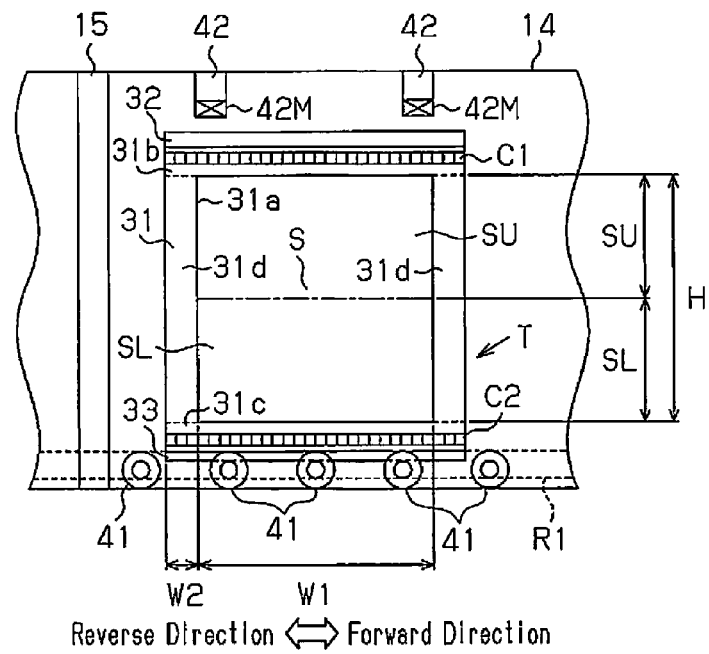
FIG. 2 is a diagram showing the internal structure of a processing chamber and a side structure of a transport tray.

The structures related to the transport tray T and transportation of the transport tray T will now be described in detail with reference to FIG. 2. As described above, the structure related to the transport tray T on the outgoing line R1 is the same as that of the structure related to the transport tray T on the incoming line R2. Therefore, only the structure of the transport tray T on the outgoing line R1 will be described below. FIG. 2 shows the internal structure of the processing chamber 14 and the structure of the transport tray T, which is transported on the outgoing line R1, as viewed from a side that is not irradiated with ion beams.

As shown in FIG. 2, a tray frame 31 of the transport tray T is a tetragonal frame and includes an attachment slot 31a, of which shape is approximately the same as that of the substrate S. The tray frame 31 includes an upper frame 31b, which supports an upper edge of the substrate S, a lower frame 31c, which supports a lower edge of the substrate S, and two side frames 31d, each of which supports a side of the substrate S. The upper barcode group C1 is applied to the entire upper frame 31b in the transport direction. Also, the lower barcode group C2 is applied to the entire lower frame 31c in the transport direction. The upper barcode group C1 and the lower barcode group C2 are applied to the surface of the tray frame 31 that is not irradiated with ion beams. In this manner, each of the barcode groups C1 and C2 is not directly irradiated with ion beams. This limits deterioration of the barcodes caused by heat or the like of ion beams.

The substrate S, which is supported by the transport tray T, has, for example, a width W1 of 2200 mm and a height H of 2400 mm. Each side frame 31d has, for example, a width W2 of 250 mm. Thus, each of the barcodes in the upper barcode group C1 and the lower barcode group C2 is an index indicating the location of the barcode on the frame from one end with a numerical value from 0 mm to 2700 mm. In other words, each barcode indicates an absolute position on the transport tray T in the transport direction. For example, a barcode that indicates 0 mm is applied to the front end of the transport tray T in the forward direction, and a barcode that indicates 2700 min is applied to the rear end of the transport tray T in the forward direction. When the transport tray T reaches the irradiation position of ion beams, the first barcode reader 23A images the upper barcode group C1. Thus, a value, which is obtained by subtracting 250 mm, which is the width W2 of the side frame 31d, from the value indicated by the barcode, that is, the imaging position of the transport tray T, is the irradiation portion of the substrate S.

In this manner, the first barcode reader 23A images the upper barcode group C1 to unambiguously identify the irradiation position of ion beams on the substrate S. This limits differences between the actual irradiation portion on the substrate and the result of the position detector. Thus, the accuracy for detecting the irradiation position on the transport tray T is increased.

A tray magnet 32 is coupled to the upper end surface of the transport tray T. A cylindrical tray slider 33 is coupled to the lower end surface of the transport tray T.

A plurality of transport rollers 41 are arranged along the outgoing line R1 on the bottom surface of the processing chamber 14. The thickness of each transport roller 41 is approximately the same as that of the tray slider 33. The circumferential surface of each transport roller 41 includes a groove to support the tray slider 33. Each transport roller 41 is coupled to a transport roller motor that rotates the transport roller 41. The transport roller 41 is rotated by the rotation produced with the corresponding transport roller motor. The transport roller motor is capable of generating rotation in the forward and reverse directions. When the transport roller motor switches the rotation directions, the rotation direction of the corresponding transport roller is switched accordingly.

In this manner, when the transport tray T is transported in the forward direction along the outgoing line R1, the transport rollers 41 rotate in the same direction. As a result, the tray slider 33 and the transport tray T are transported in the forward direction. To transport the transport tray T in the reverse direction along the outgoing line R1, the rotation of the transport rollers 41 is reversed. As a result, the transport tray T is transported in the reverse direction.

The upper wall of the processing chamber includes a plurality of support portions 42, each of which includes a support magnet 42M. The support portions 42 are arranged on the side opposite to where the transport rollers 41 are arranged. Each support magnet 42M interacts with the tray magnet 32 when the tray magnet 32 reaches a position below the support magnet 42M. In this manner, the transport tray T is remains held in the same position when transported along the outgoing line R1. When the transport tray T is transported along the outgoing line R1, for example, the transport tray T is kept tilted toward the opposite side of the ion sources 21L and 21U by a predetermined angle, for example, 3° from a vertical position relative to the bottom wall of the processing chamber 14. Thus, when the ion beams irradiating the substrate S vibrates the substrate S, the substrate S cannot be easily removed from the transport tray T compared with when the transport tray T is transported held upright to be orthogonal to the bottom wall portion of the processing chamber 14.

The structures related to transportation of the transport tray T along the outgoing line R1 and the incoming line R2 in the load lock chamber 12 and the buffer chamber 13 are the same as the processing chamber 14 except in that the support portions 42 are omitted.

Detail Structure of Barcode

The barcode groups C1 and C2, each of which is applied to the transport tray T, will now be described with reference to FIG. 3. Although the upper barcode group C1 and the lower barcode group C2 differ in the locations where they are applied, the structure of the tray frame 31 where the barcode groups C1 and C2 are applied are the same. Therefore, a portion of the upper barcode group C1 will be described below. FIG. 3 shows the upper barcode group C1 as viewed from the first barcode reader 23A.

Figure 3A:
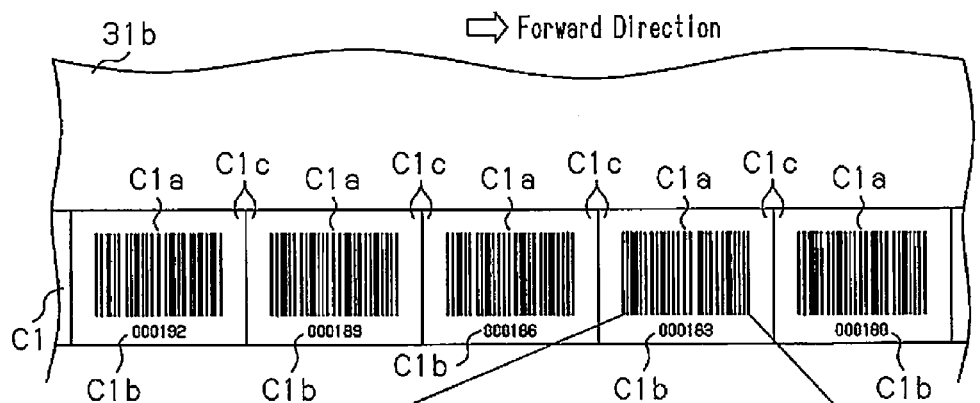
FIG. 3A is an enlarged view showing some of upper barcodes.

As shown in FIG. 3A, the upper barcode group C1 includes a plurality of barcodes C1a. A numerical value C1b, which indicates a length of the upper frame 31b from the front end in the forward direction, to the position where the barcode C1a is applied, is printed under each barcode C1a. Each barcode C1a is surrounded by a blank portion C1c.

Each of the first barcode reader 23A and the fourth barcode reader 23D, which reads the upper barcode group C1, includes an imaging unit that images the upper barcode group C1 in a predetermined cycle and detects, from the image of the upper barcode group C1 captured by the imaging unit, the position of the transport tray T relative to the imaging position.

Figure 3B:
FIG. 3B is a diagram of the information read from an upper barcode by a first barcode reader.

When the image captured by the imaging unit includes "000183" as shown in FIG. 3A, that is, the barcode C1a indicating a position separated by 183 mm from one end of the upper frame 31b, and portions of the adjacent barcodes, each of the barcode readers 23A and 23D converts the image to binary data as shown in FIG. 3B. Each of the barcode readers 23A and 23D decodes the binary data to detect the length from the front end of the upper frame 31b in the forward direction to the imaging position, which is the position of the transport tray T relative to the imaging position, in the predetermined cycle. By detecting the length from the front end in the forward direction to the imaging position, the length from the front end in the reverse direction to the imaging position is detectable. That is, the length from one end in the transport direction, which includes the forward direction and the reverse direction, to an imaging position is detectable.

The second barcode reader 23B and the third barcode reader 23C, which read the lower barcode group C2, are located in the processing chamber 14 at positions that differ from the first barcode reader 23A and the fourth barcode reader 23D. Otherwise, the structures of second barcode reader 23B and the third barcode reader 23C are the same as the first barcode reader 23A and the fourth barcode reader 23D.

One known example of a so-called absolute type linear encoder, which detects the absolute position as described above, is an electromagnetic induction linear encoder. An electromagnetic induction linear encoder includes a scale, which is a tape marked with calibrations or the like, and a reader, which detects the calibrations while changing positions relative to the scale. The distance from the scale to the reader needs to be within approximately a few millimeters for the reader to be able to detect the calibrations.

If the transport tray T were to be transported held generally orthogonal to the bottom wall portion of the processing chamber 14, the transport tray T may sway in a direction generally orthogonal to the transport direction. This varies the distance between the scale, which is coupled to the transport tray T, and the reader. As described above, the detectable range of the reader is approximately a few millimeters. Thus, when the transport tray T sways, the distance between the scale, which is coupled to the transport tray T, and the reader may exceed the detectable range of the reader. This would lower the reliability of the detected distance in the electromagnetic induction linear encoder.

Additionally, there is a need for the reader to be located in the processing chamber, which is in a vacuum condition. Thus, the amount of outgas needs to be within a certain amount and grains forming particles should not collect on the reader.

In this regards, each of the barcode readers 23A to 23D in the present embodiment is an optical linear encoder, which includes the imaging unit, and does not contact the barcode groups C1 and C2, which serve as scales. This allows for each of the barcode readers 23A to 24D to detect the barcode C1a over a long distance as compared to the electromagnetic induction linear encoder. Thus, the barcode C1a is detectable even when the transport tray T sways as described above. As a result, in the barcode readers 23A to 23D and the barcode groups C1 and C2 of the present embodiment, the absolute position is detectable, and the reliability of the detected distance is increased.

Each of the barcode readers 23A to 23D is arranged outside the processing chamber 14. As each of the barcode groups C1 and C2 moves, the position of each of the barcode groups C1 and C2 change relative to each of the barcode readers 23A to 23D. In this manner, the use of the barcode readers 23A to 23D eliminates the restrictions that would be imposed when using an electromagnetic induction linear encoder, and allows for the detection of the absolute position.

Electrical Configuration of Ion Beam Irradiation Device

Figure 4:
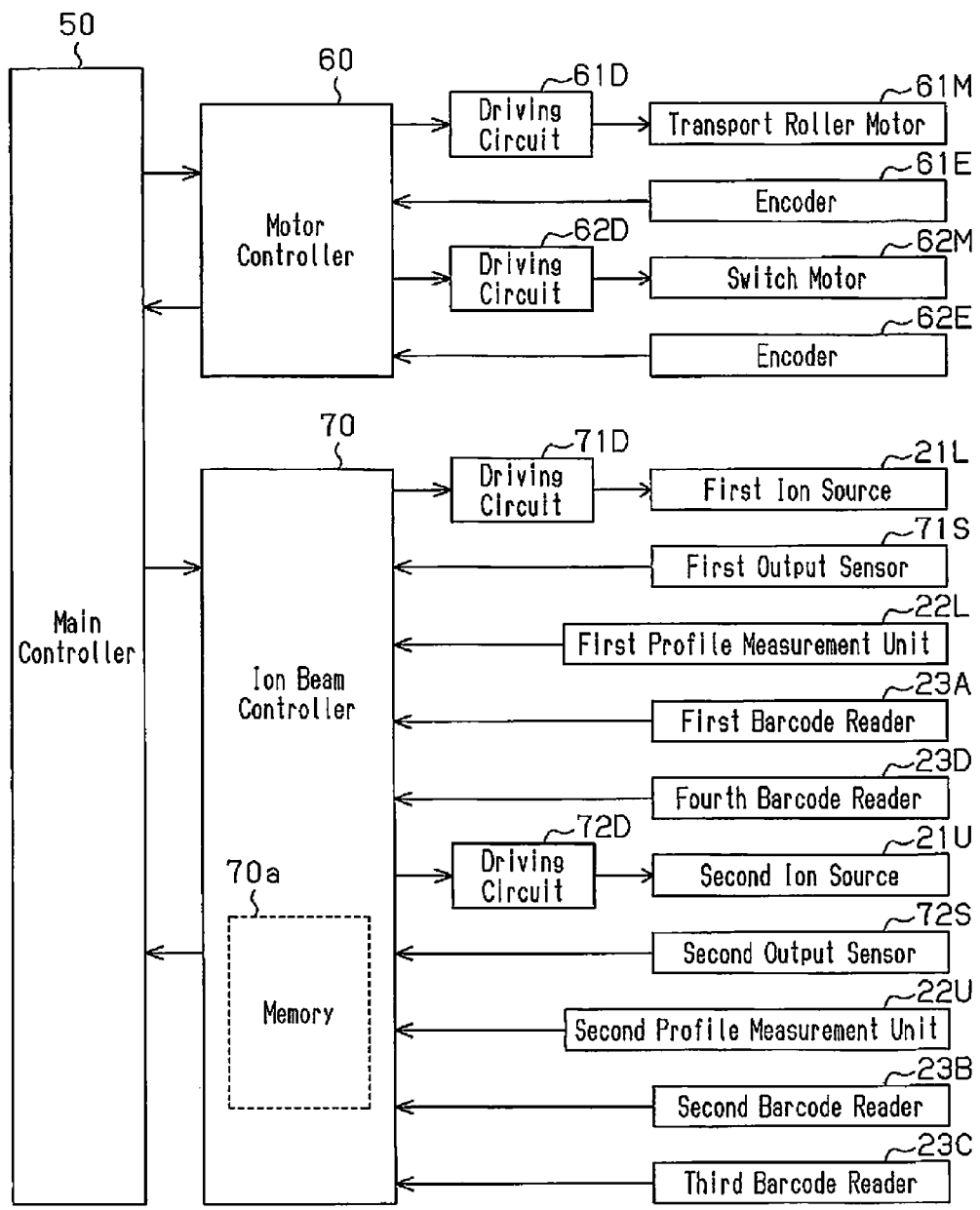
FIG. 4 is a block diagram showing the electrical configuration of an ion beam irradiation device.
Figure 5:
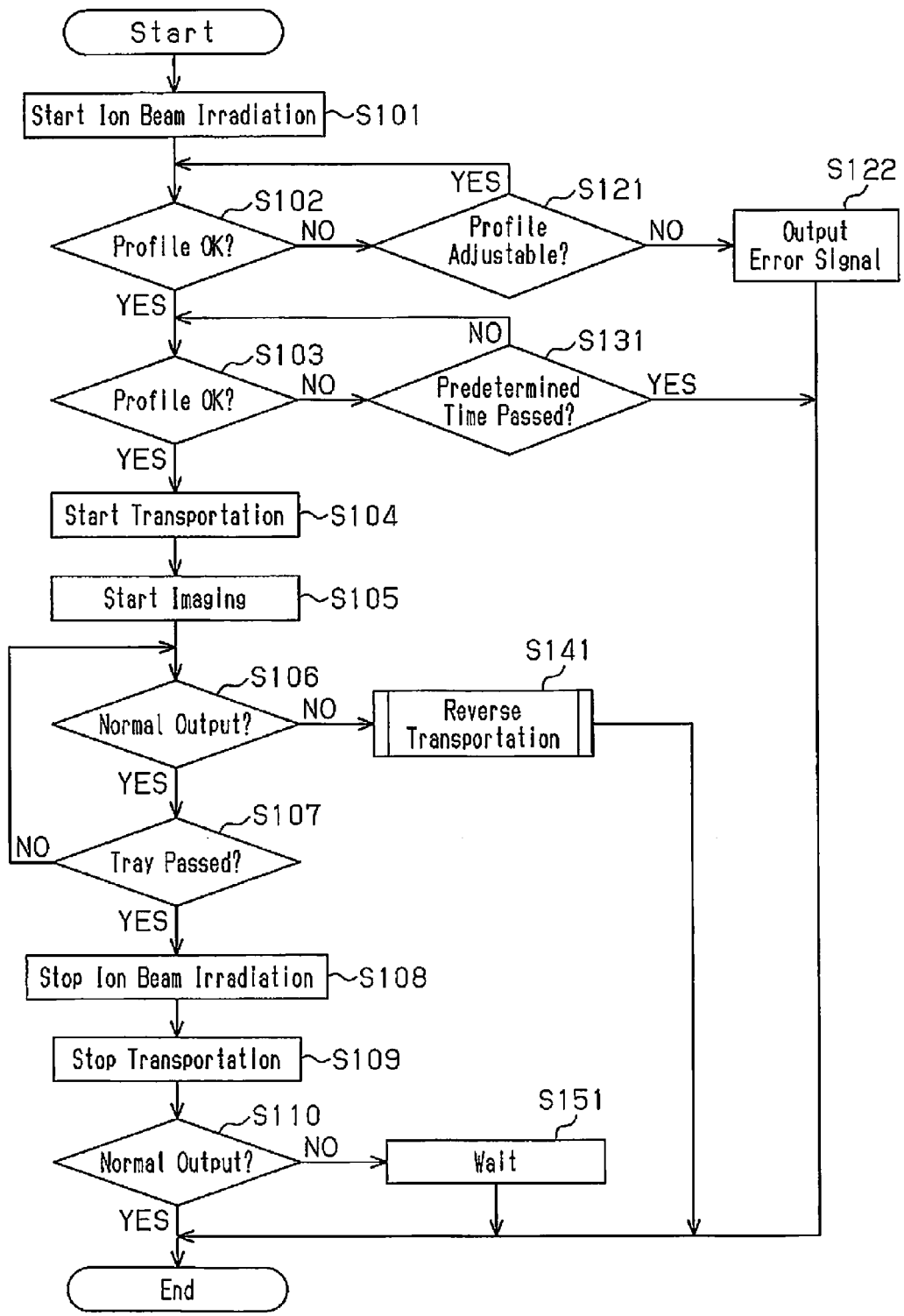
FIG. 5 is a flowchart showing the procedures for performing an ion beam irradiation process.

The electrical configuration of the ion beam irradiation device 10 will now be described with reference to FIG. 4. FIG. 4 shows the electrical configuration related to ion beam irradiation and transportation of the transport tray T in the processing chamber 14. These configurations will be described below. The electrical configurations of structures other than the processing chamber 14, for example, the structure related to the transportation of the transport tray T through the chambers 11, 12 and 13, and the structure related to the opening and closing of each gate valve 15 will not be described.

A main controller 50, which is arranged in the ion beam irradiation device 10, is mainly formed by a microcomputer, which includes a central processing unit (CPU), a nonvolatile memory (ROM), and a volatile memory (RAM). Based on various data and programs stored in the ROM and RAM, the main controller 50 performs various controls associated with operations of the ion beam irradiation device 10.

A motor controller 60, which is connected to the main controller 50, controls the operations of various motors installed in the processing chamber 14, especially motors for transporting the transport tray T. A drive circuit 61D and an encoder 61E are connected to the motor controller 60. The drive circuit 61D drives a transport roller motor 61M, which is connected to a transport roller 41, and generates rotation with the transport roller motor 61M. The encoder 61E detects a rotation position of the transport roller motor 61M. The motor controller 60 generates a position instruction based on a drive instruction, which is received from the main controller 50, and a rotation position, which is received from the encoder 61E, and outputs the position instruction to the drive circuit 61D.

Based on the position instruction, which is received from the motor controller 60, the drive circuit 61D generates drive current for the transport roller motor 61M and outputs the drive current to the transport roller motor 61M. The transport roller motor 61M generates rotation corresponding to the received drive current to rotate the transport roller 41. The drive circuit 61D and the encoder 61E are provided for each transport roller motor 61M.

When the deviation between the rotation position, which is received from the encoder 61E, and the position instruction becomes less than or equal to a predetermined value, the motor controller 60 generates a completion signal, which indicates that the operation of the transport roller motor 61M based on the drive instruction has been completed, outputs the completion signal to the main controller 50, and waits for a further drive instruction from the main controller 50.

Additionally, a drive circuit 62D and an encoder 62E are connected to the motor controller 60. The drive circuit 62D generates rotation and drives a switch motor 62M, which is included in each switch unit TR, to generate rotation with the switch motor 62M. The encoder 62E detects a rotation position of the switch motor 62M. The motor controller 60 calculates a position instruction based on the drive instruction, which is received from the main controller 50, and a rotation position, which is received from the encoder 62E, and outputs the position instruction to the drive circuit 62D.

Based on the position instruction, which is received from the motor controller 60, the drive circuit 62D generates drive current for the switch motor 62M and outputs the drive current to the switch motor 62M. The switch motor 62M generates rotation corresponding to the received drive current to drive the switch unit TR. The drive circuit 62D and the encoder 62E are provided for each transport roller motors 61M forming a switch unit TR.

When the deviation between the rotation position, which is received from the encoder 61E, and the position instruction becomes less than or equal to a predetermined value, the motor controller 60 generates a completion signal, which indicates that the operation of the switch motor 62M based on the drive instruction has been completed, outputs the completion signal to the main controller 50, and waits for a further drive instruction from the main controller 50. A transport unit includes the motor controller 60, the drive circuit 61D, the transport roller motor 61, the transport roller 41, and the encoder 61E.

An ion beam controller 70, which controls and drives the ion sources 21L and 21U, is connected to the main controller 50. A drive circuit 71D, which operates the first ion source 21L to output ion beams, a first output sensor 71S, which detects the output from the first ion source 21L, and the first profile measurement unit 22L are connected to the ion beam controller 70.

Based on a drive instruction, which is received from the main controller 50, and measurement data, which is received from the first profile measurement unit 22L, the ion beam controller 70 generates an output instruction and outputs the output instruction to the drive circuit 71D. The first profile measurement unit 22L generates measurement data corresponding to the measured result such as the intensity distribution of ion beams and outputs the measurement data to the ion beam controller 70.

Based on an output instruction, which is received from the ion beam controller 70, the drive circuit 71D generates drive current for the first ion source 21L and outputs the drive current to the first ion source 21L. The first ion source 21L outputs ion beams corresponding to the received drive current.

When the operation of the first ion source 21L is completed based on the drive instruction, the ion beam controller 70 generates a completion signal, outputs the completion signal to the main controller 50, and waits for a further instruction from the main controller 50.

The first output sensor 71S is, for example, a sensor that detects the current flowing through a filament of the first ion source 21L. When the detected current value is less than or equal to a predetermined value, the first output sensor 71S generates an output stop signal, which indicates that the output of ion beams has stopped, and outputs the output stop signal to the ion beam controller 70.

The first barcode reader 23A and the fourth barcode reader 23D, each of which reads the upper barcode group C1 of the transport tray T, are connected to the ion beam controller 70. The first barcode reader 23A and the fourth barcode reader 23D each detect the absolute position from the portion of the upper barcode group C1 imaged at the imaging position, generates position data corresponding to the imaging position in a predetermined imaging cycle, and outputs the position data to the ion beam controller 70. When the first output sensor 71S outputs the output stop signal, the position data, which is generated in an imaging cycle in which the output stop signal is output, is stored in a memory 70a of the ion beam controller 70. In this manner, the position data, which is input to the ion beam controller 70 and corresponds to the result detected from the first output sensor 71S, is stored in the memory 70a.

A drive circuit 72D, which operates the second ion source 21U to output ion beams, a second output sensor 72S, which detects the output from the second ion source 21U, and the second profile measurement unit 22U are connected to the ion beam controller 70.

Based on a drive instruction, which is received from the main controller 50, and measurement data, which is received from the second profile measurement unit 22U, the ion beam controller 70 generates an output instruction and outputs the output instruction to the drive circuit 72D. The second profile measurement unit 22U generates measurement data, in the same manner as the first profile measurement unit 22L, and outputs the measurement data to the ion beam controller 70.

Based on an output instruction, which is received from the ion beam controller 70, the drive circuit 72D generates drive current for the second ion source 21U and outputs the drive current to the second ion source 21U. The second ion source 21U outputs ion beams corresponding to the received drive current.

When the operation of the second ion source 21U is completed based on the drive instruction, the ion beam controller 70 generates a completion signal, outputs the completion signal to the main controller 50, and waits for a further instruction from the main controller 50.

The second output sensor 72S is, for example, a sensor that detects the current flowing through a filament. When the detected current value is less than or equal to a predetermined value, the second output sensor 72S generates an output stop signal, which indicates that the output of ion beams has stopped, and outputs the output stop signal to the ion beam controller 70.

The second barcode reader 23B and the third barcode reader 23C, each of which reads the lower barcode group C2 of the transport tray T, are connected to the ion beam controller 70. The second barcode reader 23B and the third barcode reader 23C each detect the absolute position from a portion of the lower barcode group C2 imaged at the imaging position, generates position data in a predetermined imaging cycle, and outputs the position data to the ion beam controller 70. When the second output sensor 72S outputs the output stop signal, the position data, which is generated in an imaging cycle in which the output stop signal is output, is stored in a memory 70a of the ion beam controller 70. Thus, the position data, which is input to the ion beam controller 70 and corresponds to the result detected from the first output sensor 72S, is stored in the memory 70a.

In this manner, the barcode readers 23A to 23D, which detect the position of the transport tray T relative to the imaging position, are connected to the ion beam controller 70, which controls and drives ion beams. Thus, data, which indicates whether or not the desired ion beams are output, and data, which is related to the position of the transport tray T corresponding to the imaging position, that is, a portion exposed to ion beams, are input to the same controller in the predetermined imaging cycle. In comparison with when such data is stored in different controllers, deviation is decreased between the position of the transport tray T relative to the imaging position when the output of ion beams is stopped, that is, a stop position, and the irradiation position of ion beams.

The ion beam controller 70, the ion sources 21L and 21U, the drive circuits 71D and 72D, and the output sensors 71S and 72S form an ion beam irradiation unit. The output sensors 71S and 72S form an output detection unit. The ion beam controller 70 forms an acquisition unit.

Operation of Ion Beam Irradiation Device

Among the operations of the ion beam irradiation device 10, the operation of ion beam irradiation that is performed in the processing chamber 14 will now be described with reference to FIGS. 5 to 10. Prior to the ion beam irradiation process, which is described below, operations such as transportation of the transport tray T in the buffer chamber 13, the opening and closing of each gate valve 15, and transportation of the transport tray T from the buffer chamber 13 to the processing chamber 14 are performed in accordance with other processing flows. Abnormal stopping occurs when the ion sources 21L and 21U are irradiating the substrate S with ion beams may be when the ion beams are stopped in an unexpected manner, or when the sensors 71S and 72S output an output stop signal. Otherwise, normal irradiation is performed. In FIGS. 7 to 10, the white arrows indicate the transportation of each of the transport trays T1 and T2 in the forward direction. In FIG. 9, black arrows indicate the transportation of the transport tray T1 in the reverse direction.

Normal Irradiation

When the ion beam irradiation process starts, the transport trays T remains still at predetermined stop positions in the processing chamber 14. One or two transport trays T are accommodated in the processing chamber 14 (refer to FIG. 7A). One example of an irradiation process in which the first ion source 21L irradiates, with ion beams, an unprocessed substrate S, which is set on transport tray T2, will now be described. At the same time, the second ion source 21U also irradiates, with ion beams, the substrate S, which is set on a preceding transport tray T1. The ion beam irradiation process is performed on the transport tray T1 in accordance with another processing flow, which is the same as the ion beam irradiation process described below.

First, in the ion beam irradiation process, the main controller 50 generates a drive instruction for the ion beam controller 70 and outputs the drive instruction. Then, the ion beam controller 70 generates an output instruction based on the drive instruction and outputs the output instruction to the drive circuit 71D. The drive circuit 71D generates drive current based on the output instruction and outputs the drive current to the first ion source 21L. Then, the first ion source 21L starts the irradiation of lower ion beams BL (step S101) (refer to FIG. 7B).

When the irradiation of lower ion beams BL starts, the first profile measurement unit 22L generates measurement data corresponding to the detected lower ion beams BL and outputs the measurement data to the ion beam controller 70. If the lower ion beams BL are output with a predetermined profile corresponding to the output instruction (step S102: YES), the ion beam controller 70 generates a completion signal, which indicates that the output of ion beams has been adjusted, and outputs the completion signal to the main controller 50.

In addition to the above completion signal, if the ion beam controller 70 outputs a completion signal indicating that the adjustment of upper ion beams BU output from the second ion source 21U has been completed within a predetermined period (step S103: YES), the main controller 50 generates a drive instruction to transport the transport tray T in the forward direction and outputs the drive instruction to the motor controller 60. The motor controller 60 generates a position instruction based on the received drive instruction and a rotation position received from the encoder 61E and outputs the position instruction to the drive circuit 61D. Then, the drive circuit 61D generates drive current corresponding to the position instruction and outputs the drive current to the transport roller motor 61M. This starts transportation of the transport tray T2 (step S104). At the same time, transportation of the transport tray T1 in the forward direction starts in the same manner.

The driving of the transport roller motors 61M starts from the one coupled to the transport roller 41 that is located at the starting end of the outgoing line R1. When the rotation generated by the transport roller motor 61M reaches a predetermined rotation position, this starts the driving of the transport roller motor 61M coupled to the adjacent transport roller 41, which is located toward the terminal end in the outgoing line R1. The driving of each transport roller motor 61M stops at a predetermined rotation position, for example, when the corresponding transport roller 41 no longer contacts the tray slider 33. In this manner, the driving of the transport roller motors 61M is sequentially performed from the starting end side of the outgoing line R1. This transports the transport tray T2 from the starting end to the terminal end of the outgoing line R1, that is, in the forward direction.

During transportation of the transport tray T2, the imaging of the upper barcode group C1, that is, the detection of the position of the transport tray T2 relative to the imaging position is started when the front end in the forward direction of the upper barcode group C1 of the transport tray T2, for example, the barcode indicating that the length from the front end of the transport tray T is 0 mm, reaches an imaging position of the first barcode reader 23A (step S105) (refer FIG. 7C).

When the first barcode reader 23A starts imaging the upper barcode group C1, ion beam irradiation of the transport tray T2 is also performed. When the first barcode reader 23A detects a barcode indicating that the length from the front end of the transport tray T is 250 mm, the irradiation of the substrate S with the lower ion beams BL is started.

The irradiation of the lower ion beams from the first ion source 21L is continued until the first barcode reader 23A detects a barcode indicating that the length from the front end of the transport tray T is 2700 mm (step S106: YES, step S107: YES). Then, the ion beam controller 70 generates an output instruction to stop the output from the first ion source 21L and outputs the output instruction to the drive circuit 71D. The drive circuit 71D generates drive current based on the received output instruction and outputs the drive current to the first ion source 21L. When receiving the drive current, the first ion source 21L stops outputting the lower ion beams BL (step S108). Then, when receiving a signal indicating that the output current of the first ion source 21L is 0 A from the first output sensor 71S, the ion beam controller 70 generates a completion signal indicating that the irradiation of ion beams has been completed by the drive instruction, outputs the completion signal to the main controller 50, and waits for a further drive instruction.

When the irradiation of the lower ion beams BL stops, the main controller 50 transports the transport tray T2 by a predetermined distance in the forward direction. Then, the main controller 50 generates a drive instruction for stopping the transportation and outputs the instruction to the motor controller 60. The predetermined distance is set so that, for example, the transport tray T2 is positioned between the irradiation position of the first ion source 21L and the irradiation position of the second ion source 21U when moved by the predetermined distance.

The motor controller 60 generates a position instruction based on the drive instruction and a rotation position received from the encoder 61E and outputs the position instruction to the drive circuit 61D. Then, the drive circuit 61D generates drive current based on the position instruction and outputs the drive current to the transport roller motor 61M. The roller motor 61M produces rotation corresponding to the drive current.

When the deviation between the rotation position, which is received from the encoder 61E, and the position instruction becomes less than or equal to a predetermined value, the motor controller 60 generates a position instruction to stop rotation generated with the transport roller motor 61M and outputs the position instruction to the drive circuit 61D. The drive circuit 61D generates drive current corresponding to the received position instruction and outputs the drive current to the transport roller motor 61M. In this manner, the transport roller motor 61M stops generating rotation. This ends transportation of the transport tray T2 (step S109).

When the transportation of the transport tray T2 ends and a signal indicating that the output from the second ion source 21U has stopped (step S110: NO), the main controller 50 generates a drive instruction to delay restarting the transportation of the transport tray T2 in the forward direction for a predetermined period and outputs the drive instruction to the motor controller 60. The motor controller 60 generates a position instruction based on the drive instruction and a rotation position received from the encoder 61E and outputs the position instruction to the drive circuit 61D. The drive circuit 61D generates drive current corresponding to the position instruction and outputs the position instruction to the transport roller motor 61M. The transport roller motor 61M stops generating rotation at a predetermined position corresponding to the received drive current. Consequently, the transport tray T2 waits at the terminal position of the transport process (step S151). The time during which transportation is continuously stopped, that is, the waiting time, is the time until the reverse transport process is completed during abnormal stopping as described below. Under this situation, the main controller 50 temporarily ends the process of the ion beam irradiation.

In addition to the first irradiation of the lower ion beams BL, the transport tray T2 sequentially undergoes the first irradiation of upper ion beams BU, the second irradiation of upper ion beams BU, and the second irradiation of lower ion beams BL before being transported out of the processing chamber 14. The driven one of the ion source 21L and 21U and the driven one of the transport roller motors 61M differs between each ion beam irradiation. However, each ion beam irradiation is performed using the same process, which is described above.

In detail, as shown in FIGS. 7D to 7F, when the first irradiation of upper ion beams BU is performed, the profile of the upper ion beams BU, which are output from the second ion source 21U, is first measured. Then, the transport tray T2 is transported toward the terminal end of the outgoing line R1 in the forward direction, and the upper region SU of the substrate S is irradiated with upper ion beams BU. In the first irradiation of upper ion beams BU, when transported to the terminal end of the outgoing line R1, the transport tray T2 is moved on the incoming line R2 by the switch unit TR. This ends the transportation of the transport tray T2. Then, the unloading process of the transport tray T1, the loading process of a transport tray T3, and the opening-closing of the gate valves 15 are performed in accordance with other processing flows.

Figure 8D:
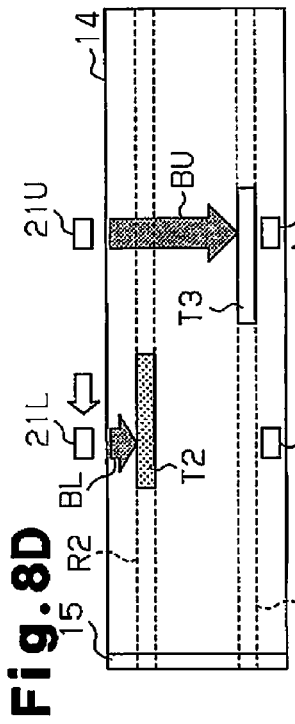
FIGS. 8A to 8E are operation diagrams sequentially showing the movement of transport trays in the ion beam irradiation process.
Figure 8E:
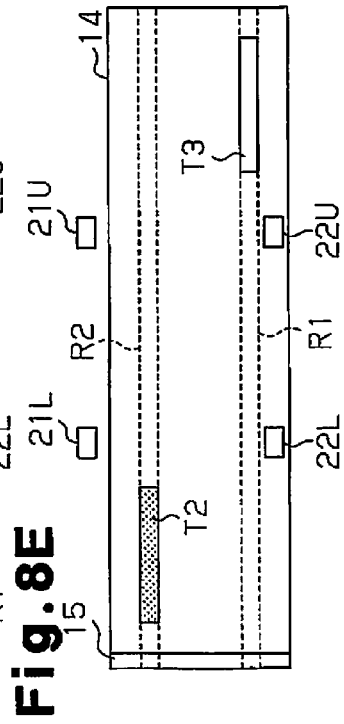
Figure 8A:
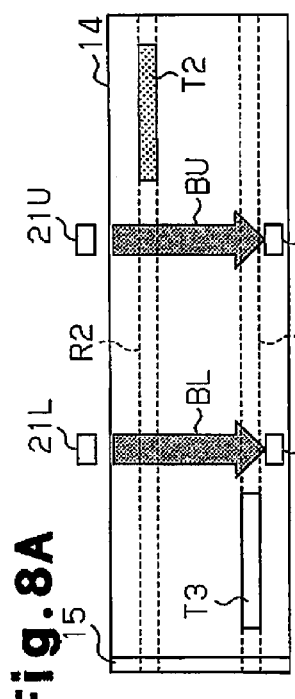
Figure 8B:
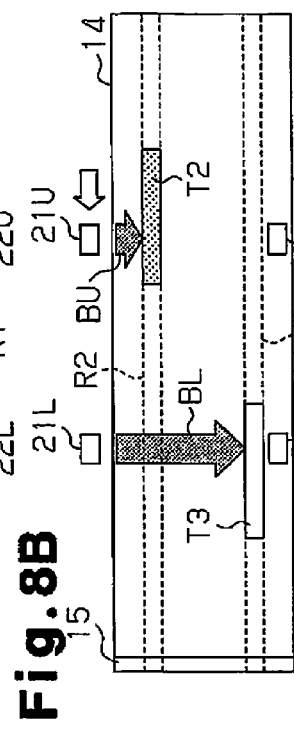

As shown in FIGS. 8A and 8B, when the second irradiation of upper ion beams BU is performed, the profile of the upper ion beams BU, which are output from the second ion source 21U, is first measured. Then, the transport tray T2 is transported toward the terminal end of the incoming line R2 in the forward direction, and the upper region SU of the substrate S is irradiated with upper ion beams BU.

Figure 8C:
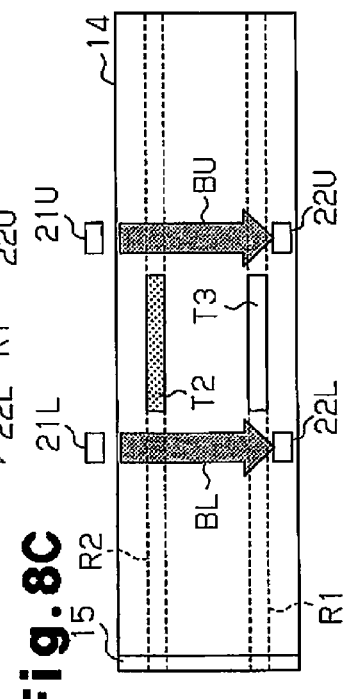

As shown in FIGS. 8C to 8E, when the second irradiation of lower ion beams BL is performed, the profile of the lower ion beams BL, which are output from the first ion source 21L, is first measured. Then, the transport tray T2 is transported toward the terminal end of the incoming line R2 in the forward direction, and the lower region SL of the substrate S is irradiated with lower ion beams BL.

Abnormal Stopping

As described above, when the transport tray T2 reaches the irradiation position of the first ion source 21L, the irradiation of the substrate S set on the transport tray T2 with lower ion beams BL is started (refer to FIG. 9A). As the transport tray T2 traverses the irradiation position of the first ion source 21L, if the irradiation of lower ion beams BL stops (refer to FIG. 9B), the first output sensor 71S generates an output stop signal for the first ion source 21L and outputs the signal to the ion beam controller 70.

The ion beam controller 70 generates an abnormal stopping signal indicating that the output from the first ion source 21L has abnormally stopped based on the received output stop signal and outputs an abnormal stopping signal to the main controller 50 (step S106: NO). Then, a reverse transport process is performed in the processing chamber (step S141).

The reverse transport process, in which the transport tray T2 is transported in the reverse direction, will now be described. In the description hereafter, it is assumed that the irradiation of the transport tray T1 with upper ion beams has been normally performed.

When receiving the above output stop signal from the first output sensor 71S, the ion beam controller 70 stores position data obtained in the imaging cycle, in which the signal has been received, as a stop position where the irradiation of lower ion beams BL stopped (step S201).

Then, in the same manner as when the irradiation from the first ion source 21L is normal, the main controller 50 generates a drive instruction to transport the transport tray T2 to the terminal position of the transport process and outputs the drive instruction to the motor controller 60. The motor controller 60 generates a position instruction based on the drive instruction and a rotation position received from the encoder 61E. The motor controller 60 then outputs the position instruction to the drive circuit 61D. The drive circuit 61D generates drive current based on the position instruction. The drive circuit 61D outputs the drive current to the transport roller motor 61M. Then, the transport roller motor 61M generates rotation corresponding to the drive current.

When the transport tray T2 is transported to the terminal position of the transport process in the forward direction, the transportation of the transport tray T2 is stopped (step S202) (refer to FIG. 9C). At this point, in the same manner as step S151 described above, the main controller 50 generates a drive instruction to have the transport tray T1 wait at the terminal position and outputs the drive instruction to the motor controller 60.

The main controller 50 generates a drive instruction for the ion beam controller 70, which instructs the first ion source 21L to output lower ion beams BL, and outputs the drive instruction to the ion beam controller 70. The ion beam controller 70 generates an output instruction based on the drive instruction and outputs the output instruction to the drive circuit 71D. The drive circuit 71D generates drive current corresponding to the output instruction and outputs the output instruction to the first ion source 21L. The first ion source 21L outputs lower ion beams BL corresponding to the drive current (step S203) (refer to FIG. 9D).

In the same manner as step S102 described above and step S121, when lower ion beams BL are output, the profile of the lower ion beams BL is adjusted. Then, the ion beam controller 70 generates a completion signal indicating that the output adjustment has been completed. The ion beam controller 70 outputs the completion signal to the main controller 50 and waits for a further instruction (step S204: YES).

When receiving the completion signal, the main controller 50 generates a drive instruction to transport the transport tray T2 in the reverse direction and outputs the drive instruction to the motor controller 60. The motor controller 60 generates a position instruction based on the received drive instruction and a rotation position received from the encoder 61E. The motor controller 60 then outputs the position instruction to the drive circuit 61D. The drive circuit 61D generates drive current based on the received position instruction and outputs the drive current to the transport roller motor 61M. This transports the transport tray T2 in the reverse direction along the outgoing line R1 (step S205) (refer to FIG. 9E).

When the barcode indicating that the length from the front end of the transport tray T in the forward direction is 2700 mm reaches an imaging position of the first barcode reader 23A, the imaging of the upper barcode group C1 and the position detection of the transport tray T relative to the imaging position are performed (step S206) in the same manner as step S105 described above. In step S105, the first barcode reader 23A images barcodes from the one indicating that the length from one end of the transport tray T is 0 mm toward the one indicating that the length from one end of the transport tray T is 2700 mm. In contrast, in step S206, the first barcode reader 23A images barcodes from the one indicating that the length from one end of the transport tray T is 2700 mm toward the one indicating that the length from one end of the transport tray T is 0 mm.

During this period, the ion beam controller 70 compares the position of the transport tray T, which is detected by the first barcode reader 23A, with the stop position, which is stored in the memory 70a in step S201 described above (step S207) (refer to FIG. 9F). If the stored stop position and the position of the transport tray T relative to the imaging position are the same, the ion beam controller 70 generates an output instruction to stop the output of ion beams from the first ion source 21L and outputs the output instruction to the drive circuit 71D. The drive circuit 71D generates drive current based on the received output instruction and outputs the drive current to the first ion source 21L. When receiving the drive current, the first ion source 21L stops outputting ion beams (step S208).

When the output of ion beams is stopped, a signal, which indicates that the output current from the first ion source 21L is 0 A is input to the ion beam controller 70. Then the ion beam controller 70 generates a completion signal, which indicates that the irradiation of ion beams has been completed, outputs the signal to the main controller 50, and waits for a further drive instruction. When receiving the completion signal, the main controller 50 generates a drive instruction to transport the transport tray T by a predetermined distance in the reverse direction and then stop the transport tray T. The main controller 50 outputs the drive instruction to the motor controller 60. The predetermined distance is set so that the transport tray T2 is located closer to the gate valves 15 than the irradiation position of the first ion source 21L when moved by the predetermined distance.

The motor controller 60 generates a position instruction based on the received drive instruction and a rotation position received from the encoder 61E and outputs the position instruction to the drive circuit 61D. The drive circuit 61D generates drive current based on the received position instruction and outputs the drive current to the transport roller motor 61M. The transport roller motor 61M generates rotation based on the received drive current. This transports the transport tray T2 to the predetermined position and then stops the transport tray T2 at the predetermined position (step S209) (refer to FIG. 10A).

When the deviation between the rotation position, which is input to the motor controller 60 from the encoder 61E, and the position instruction becomes less than or equal to a predetermined value, the motor controller 60 generates a position instruction to stop rotation generated with the transport roller motor 61M and outputs the position instruction to the drive circuit 61D. The drive circuit 61D generates drive current based on the received position instruction and outputs the drive current to the transport roller motor 61M. This stops rotation generated with the transport roller motor 61M. Additionally, the motor controller 60 generates a completion signal, which indicates that the operation of the transport roller motor 61M based on the drive instruction has been completed corresponding to the drive instruction, outputs the completion signal to the main controller 50, and waits for a further drive instruction.

When receiving the completion signal, the main controller 50 generates a drive instruction to transport the transport tray T2 by a predetermined distance toward the terminal end of the outgoing line R1 in the forward direction and outputs the drive instruction to the motor controller 60.

The motor controller 60 generates a position instruction based on the received drive instruction and a rotation position received from the encoder 61E and outputs the position instruction to the drive circuit 61D. The drive circuit 61D generates drive current based on the received position instruction and outputs the drive current to the transport roller motor 61M. Based on the received drive current, the transport roller motor 61M generates rotation in a direction opposite to the reverse transportation (steps S205 to S209). This transports the transport tray T2 in the forward direction along the outgoing line R1 (step S210) (refer to FIG. 10B). The predetermined distance is set so that when moved by the predetermined distance, the transport tray T2 is positioned between the irradiation position of the first ion source 21L and the irradiation position of the second ion source 21U on the outgoing line R1, that is, the transport tray T2 faces the transport tray T1 that has been stopped on the incoming line R2. In this manner, the transport tray T2 is transported to the above position and stopped (step S211) (refer to FIG. 10C).

When the deviation between the rotation position, which the encoder 61E outputs to the motor controller 60, and the position instruction becomes less than or equal to a predetermined value, the motor controller 60 generates a completion signal, which indicates that the operation of the transport roller motor 61M based on the drive instruction has been completed, and outputs the completion signal to the main controller 50. Then, the main controller 50 temporarily ends the reverse transport process of the transport tray T2.

A situation, in which the output of the lower ion beams BL stops when the first ion source 21L is irradiating the transport tray T2 with lower ion beams BL on the outgoing line R1 has been described above. However, such a reverse transport process may be performed when the irradiation of the transport tray T2 with upper ion beams BU stops on the outgoing line R1, when the irradiation of the transport tray T1 with upper ion beams BU stops on the incoming line R2, and when the irradiation of the transport tray T1 with lower ion beams BL stops on the incoming line R2. In such cases, the reverse transport process is performed in the same manner as descried above although there may be differences in the driven one of the ion sources 21L and 21U that irradiates the transport tray T, the imaged one of the barcode groups C1 and C2, the operated one of the barcode readers 23B to 23D that images the barcodes, and the transportation line of the transport tray T. When the ion beam irradiation of both transport trays T1 and T2 abnormally stop, reverse transport processes are simultaneously performed on the transport trays T1 and T2.

In this manner, the irradiation position of ion beams on the substrate S when the relative movement stops, which is the position of the transport tray T relative to the imaging position detected in the corresponding image cycle, is stored as a stop position. After the transport tray T is transported to a region that is not irradiated with ion beams, the irradiation of ion beams is started again. Then, the transportation of the transport tray T and substrate S is started in the direction opposite to that when the previous ion beam irradiation was performed. When the position of the transport tray T relative to the imaging position reaches the stop position, the irradiation of ion beams is stopped.

In such a reverse transport process, the irradiation of ion beams can be performed on a region that has not been irradiated with ion beams. The irradiation of ion beams subsequent to the output stopping is performed by checking the profile of the ion beams and then performing transportation in the reverse direction. Thus, the substrate S is irradiated with ion beams of which output is further stabilized a certain level compared to when the irradiation is performed during transportation in the forward direction. This limits variations in the irradiation amount of ion beams over the plane of the substrate S and allows for the irradiation to be performed on the entire substrate S in the transport direction even when the irradiation of ion beams stops before completion.

Abnormal Beam Profile

In the ion beam irradiation process, when the output ion beams do not have the predetermined profile corresponding to the output instruction (step S102: NO), the ion beam controller 70 generates an output instruction based on the drive instruction received from the main controller 50 and the measurement data received from the first output sensor 71S. Then, the ion beam controller 70 outputs the output instruction to the drive circuit 61D again. The drive circuit 61D generates drive current based on the output instruction and outputs the drive current to the first ion source 21L. Then, the first ion source 21L outputs ion beams. When the irradiation of ion beams is started based on the drive current that is changed in this manner, the first profile measurement unit 22L outputs the measurement data of ion beams, which is obtained after the change, to the ion beam controller 70.

The ion beam controller 70 compares the measurement data before and after changing the drive current. If the measurement data has been changed by a predetermined value, the ion beam controller determines that the profile of the ion beams is adjustable (step S121: YES) and again compares the profile of the ion beam output with the predetermined profile corresponding to the drive instruction (step S102). If the profile of the ion beams is not adjustable (step S121: NO), the ion beam controller 70 generates an error signal, which indicates that the profile is not adjustable, and outputs the error signal to the main controller 50 (step S122). Then, the main controller 50 temporarily ends the irradiation of ion beams.

Even when the adjustment of the output from the first ion source 21L is completed (step S102: YES), as long as the adjustment of the output from the second ion source 21U is not completed within a predetermined time (step S102: NO, step S131: YES), the main controller 50 temporarily ends the ion beam irradiation process.

In the same manner as the ion beam irradiation process, in the reverse transport process, when ion beams are not output in accordance with the predetermined profile corresponding to the output instruction (step S204: NO), the ion beam controller 70 generates an output instruction based on the drive instruction received from the main controller 50 and the measurement data received from the first output sensor 71S and outputs the output instruction to the drive circuit 61D again. The drive circuit 61D generates drive current based on the updated output instruction and outputs the drive current to the first ion source 21L. Then, the first ion source 21L generates outputs according to the drive current. If the profile of ion beams is adjustable (step S221: YES), the process is repeated until the profile of ion beams is adjusted to the predetermined profile. If the profile of ion beams is not adjustable, the ion beam controller 70 generates an error signal, which indicates that the profile is not adjustable, and outputs the error signal to the main controller 50 (step S222). When receiving the error signal, the main controller 50 temporarily ends the reverse transport process.

As described above, the present embodiment has the advantages described below.

(1) By imaging each barcode C1a, which indicates a position on the transport tray T, the position of the transport tray T relative to the imaging position is detected. The relative relation between an imaging position, where the barcode C1a is imaged, and an irradiation position, to which ion beams are emitted, is continuously maintained in a predetermined relationship during transportation of the transport tray T. Therefore, whenever the barcode readers 23A to 23D each detect the barcode C1a, the irradiation position relative to the transport tray T is detectable. This allows for the irradiation position of the transport tray T to be directly detected in comparison with when the position of the transport tray is detected from the operation amount of the transport unit, which transports the transport tray. Thus, even when there are differences between the transport roller 41, which forms the transport unit that transports the transport tray T, and the transport tray T, errors resulting from such differences would be limited. This increases the accuracy for detecting an irradiation position of the substrate S, which is supported by the transport tray T.

(2) The detection result from each of the barcode readers 23A to 23D and the detection result from each of the output sensors 71S and 72S are associated with one another and stored in the memory 70a. This allows for recognition of the portion of the substrate S irradiated with the desirable output of ion beams from information stored in the memory 70a. In other words, the portion of the substrate S that is irradiated with an undesirable output of ion beams and the portion of substrate S that is not irradiated with ion beams may be recognized. This increases the accuracy of a process performed on a portion of the substrate S where the irradiation of ion beams is insufficient to compensate for the insufficient irradiation.

(3) Among the irradiation positions of the substrate S, the position where the output stops may be recognized. This increases the detection accuracy of the position where the output of ion beams stopped. Therefore, a further irradiation process may be performed with high accuracy on a portion of the substrate S that was not irradiated with ion beams.

(4) When detecting that the output of ion beams has been stopped, the position of the transport tray T relative to the imaging position is stored in the memory 70a as the stop position associated with the stopping of the output. When the position of the transport tray T relative to the imaging position is between the stop position and the terminal position, ion beams are output again. Therefore, further irradiation of a portion that has not been irradiated with ion beams may be performed with high accuracy.

(5) When detecting that the output of ion beams has been stopped, the position of the transport tray T relative to the image position is stored in the memory 70a as the stop position associated with the stopping of the output. After the transport tray T is transported to a non-irradiation position, the irradiation of ion beams is started again and the transportation of the transport tray T is started in the direction opposite to that of the previous irradiation. When the position of the transport tray T relative to the imaging position reaches the stop position, the irradiation of ion beams stops. Therefore, further irradiation of a portion of the substrate S that has not been irradiated with ion beams may be performed with high accuracy.

(6) After the output is stopped, the ion beam irradiation of the transport tray T, which is transported in the reverse direction, is performed. Thus, the substrate S is irradiated with ion beams, of which output is further stably maintained at the set value, compared with when the transport tray T is transported from the stop position in the forward direction. This limits variations in the irradiation amount over the substrate plane and allows for the irradiation amount to be uniform throughout the plane of the substrate S even when the output of ion beams stops before completion of the irradiation.

(7) A plurality of the barcodes C1a are applied to the transport tray T. More specifically, the barcodes C1a are applied to the transport tray T entirely from the front end to the rear end in the forward direction. This aspect allows for the position of the transport tray T relative to the imaging position to be obtained entirely from the front end to the rear end of the transport tray T. Thus, regardless of where the transport tray T is located in the forward direction, the accuracy for detecting the position of the transport tray T may be increased.

(8) The barcode readers 23A to 23D are each located at the side of the transport tray T opposite to the ion sources 21L and 21U. Thus, the barcodes groups C1 and C2, which are imaged by the barcode readers 23A to 23D, are located at the same side of the transport tray T as the barcode readers 23A to 23D. In this aspect, each of the barcode groups C1 and C2 is located at the side of the transport tray that is not irradiated with ion beams. This limits deterioration in the outer appearance of each barcode group C1 and C2 caused by heat or the like of ion beams. Consequently, decreases are limited in the accuracy for detecting the irradiation position of ion beams that would be caused by the deteriorated outer appearance of each barcode group C1 and C2.

(9) The barcode readers 23A to 23D are located at positions on the transport tray T that do not face the ion sources 21L and 21U. This limits heat deterioration of the imaging mechanism of each barcode reader 23A to 23D caused by heat or the like of ion beams. Consequently, decreases are limited in the accuracy for detecting the irradiation position of ion beams that would be caused by the deteriorated outer appearance of each barcode group C1 and C2.

(10) The irradiation portion of the substrate S includes the lower region SL and the upper region SU. The lower region SL and the upper region SU are each irradiated by the different ion sources 21L and 21U. Under this situation, the irradiation of the substrate S is performed by a plurality of the ion sources 21L and 21U. Thus, the ion beam irradiation of the substrate S may be performed in various manners as compared to when the ion beam irradiation is performed on the substrate S with a single ion source. This easily realizes the desirable irradiation amount on the substrate plane. Additionally, adjustments may be made to the ion beam irradiation of each ion source 21L and 21U. This simplifies the ion beam irradiation of each ion source 21L and 21U and improves the throughput of the ion beam irradiation process as compared to a structure in which the regions of the ion beam irradiation overlap.

(11) The transport tray T includes the upper barcode group C1 and the lower barcode group C2. The upper barcode group C1 is arranged in the upper region SU of the transport tray T. The lower barcode group C1 is arranged in the lower region SL of the transport tray T. When the upper region SU is irradiated with ion beams, the second barcode reader 23B and the third barcode reader 23C each image the lower barcode group C2. When the lower region SL is irradiated with ion beams, the first barcode reader 23A and the fourth barcode reader 23D each image the upper barcode group C1. Thus, ion beams output from the ion sources 21L and 21U reach the substrate S without being interfered by the barcode readers 23A to 23D. That is, the barcode readers 23A to 23D are not irradiated with ion beams output from the ion sources 21L and 21U. Thus, the irradiation of the substrate S with ion beams is not interfered. This increases the accuracy for detecting the irradiation position of ion beams.

The above embodiment may be modified as described below.

The ion beam irradiation device 10 may have a structure that does not include the reverse transport process. For example, while transporting the transport tray T in the forward direction, the ion beam irradiation device 10 may transport the transport tray T so that a portion, which has not been irradiated with ion beams, is irradiated again. Alternatively, the irradiation of a portion that has not been irradiated with ion beams may be performed by a different ion beam irradiation device. In this situation, a preferred structure allows for the transfer of data of the stop position between the two ion beam irradiation devices.

The barcode readers 23A to 23D may each be connected to a controller that differs from the ion beam controller 70, for example, the main controller 50.

The first barcode reader 23A and the fourth barcode reader 23D may be omitted. Alternatively, the second barcode reader 23B and the third barcode reader 23C may be omitted. Accordingly, one of the barcode groups C1 and C2 may be applied to one of the upper frame 31b and the lower frame 31c in accordance with the location of the barcode readers.

Each of the barcode groups C1 and C2 may be arranged in such a manner that the barcode indicating 0 mm is applied to the front end of the transport tray T in the reverse direction, and the barcode indicating 2700 mm is applied to the rear end of the transport tray T in the reverse direction.

The barcode groups C1 and C2 may be directly marked on the transport tray T instead of using a tape applied to the transport tray T.

Figure 11:
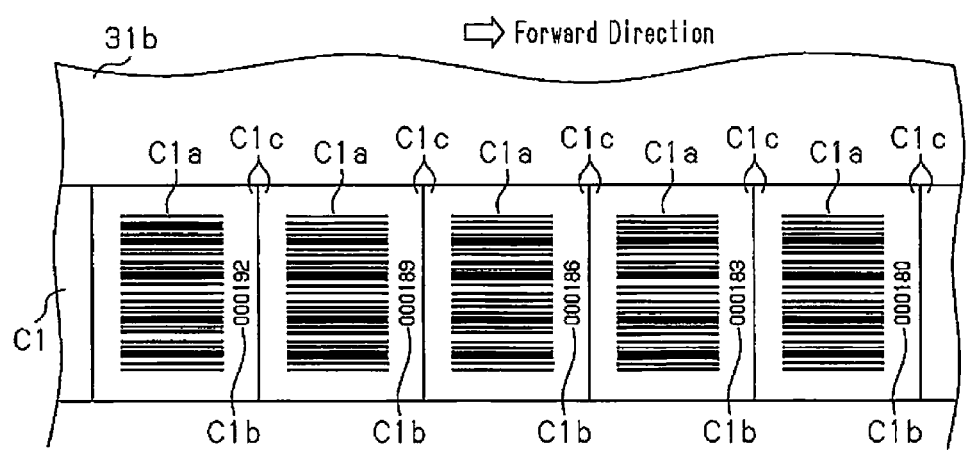
FIG. 11 is an enlarged view of some of upper barcodes in a modified example.

A modified example of the barcode groups C1 and C2 applied to the transport tray T will now be described with reference to FIG. 11. For the same reason as described above, a portion of the upper barcode group C1 will be described below. FIG. 11 shows the upper barcode group C1 as viewed from the first barcode reader 23A.

As shown in FIG. 11, the upper barcode group C1 includes a plurality of the barcodes C1a. A plurality of bars forming the barcode C1a are each printed in a direction parallel to the transport direction. In contrast, as shown in FIG. 3A, in the present embodiment, a plurality of bars forming the barcode C1a are each printed in a direction orthogonal to the transport direction. The numerical value C1b is printed at the right side of the corresponding barcode C1a in the transport direction. Alternatively, the numerical value C1b may be printed at the left side of the corresponding barcode C1a in the transport direction, or above or below the corresponding barcode C1a. In the same manner as the barcode C1a in the present embodiment, each barcode C1a is surrounded by a blank portion C1c.

Each of the first barcode reader 23A and the fourth barcode reader 23D, which reads the upper barcode group C1, includes an imaging unit that images the upper barcode group C1 in a predetermined cycle. The barcode readers 23A and 23D each detect, from the image of the upper barcode group C1 captured by the imaging unit, the position of the transport tray T relative to the imaging position. The imaging unit obtains an image, which is included within a predetermined imaging range. A width of the imaging range in the direction orthogonal to the transport direction is set as a dimension that includes every one of the bars forming each barcode C1a and the blank portion C1c including portions located above and below the barcode C1a.

When the image captured by the imaging unit includes "000183" as shown in FIG. 11, that is, the barcode C1a indicating a position separated by 183 mm from one end of the upper frame 31b, each of the barcode readers 23A and 23D sequentially converts the image to binary data, for example, from the lower side. The barcode readers 23A and 23D each decode the binary data and detect the length from the front end of the upper frame 31b in the forward direction to the imaging position, which is the position of the transport tray T relative to the imaging position, in a predetermined cycle.

As compared with the arrangement shown in FIG. 3A, when the barcode group C1 is arranged as shown in FIG. 11, the transport position of the transport tray T may be detected with higher decoding performance. More specifically, in the structure of FIG. 11, the barcodes C1a are each located parallel to the transport direction. This allows for more barcode groups C1 to be arranged within the same region (upper frame or lower frame) as compared with the structure in FIG. 3A. This shortens the reading interval of each barcode C1a in the transport direction and improves the detection resolution of the transport position using each barcode C1a. Thus, the accuracy for position detection of the transport tray T is increased.

The irradiation position of each ion source 21L and 21U may be a position extending throughout the heightwise direction of the substrate S or a position divided into three or more portions in the heightwise direction of the substrate S. It is only necessary for the irradiation position to cover the entire direction of the substrate S in a direction intersecting the transport direction.

The same region of the substrate S may be irradiated with ion beams three or more times. Also, the same region of the substrate S may be irradiated with ion beams just once.

The transport tray T may be transported held upright to be orthogonal to the bottom wall of the processing chamber 14.

The barcode readers 23A to 23D may be located at the same side as the ion sources 21L and 21U. In such a structure, the barcode groups C1 and C2, which are included in the transport tray T, is applied to the side of the tray frame 31 that is irradiated with ion beams.

An index included in the transport tray T is not limited to a barcode. The index may be a two-dimensional code or only the numerical value described above. It is only necessary that different indices be arranged in the transport direction to indicate positions of the transport tray.

A position detector may be located at a position facing the irradiation position of an ion beam irradiation unit. In this case, a preferred structure includes a separate shield portion, which shields ion beams, so that the position detector is not irradiated with ion beams emitted to the irradiation position.

Each output sensor 71S and 72S serving as an output detector, which detects the output of ion beams, is not limited to a sensor outputting the detection result when detecting that the amount of the current flowing through a filament, which is the output value of ion beams, is less than or equal to a predetermined value. Each output sensor 71S and 72S may be a sensor outputting the output value of ion beams as the detection result. In this case, preferably, a separate ion beam controller determines whether or not the output of ion beams is less than or equal to the predetermined value. When the output detector, which detects the output of ion beams, outputs the output value of ion beams as the detection result, the detection result of the position detector may be associated with the detection result of the output detector and stored in predetermined cycles. In such a structure, the irradiation amount of each portion on the entire substrate S may be obtained. The ion beam irradiation device may omit such an output detector.

A detection cycle in which the output detector detects the output value of ion beams may differ from that in which the position detector detects the position of the transport tray. It is only necessary for the detection result of the position detector and the latest detection result of the output detector obtained during the corresponding position detection to be stored in association.

In the present embodiment, when the output of ion beams abnormally stops, the substrate S transported in the reverse direction is irradiated, with ion beams, toward the stop position. Instead, when the output of ion beams decreases, the irradiation of ion beams may be performed in a manner described below.

For example, the first output sensor and the second output sensor are sensors that detect temporal and spatial profiles of ion beams output from the ion sources 21L and 21U. When detecting that the profile is less than or equal to a threshold, each output sensor generates an output decline signal, which indicates that the output of ion beams has decreased, and outputs the output decrease signal to the ion beam controller 70. Also, each output sensor detects the profile of ion beams and outputs the detected profile to the ion beam controller 70 in each predetermined period from when the output decline signal is generated to when transportation of the transport tray in the forward direction is completed.

When receiving the output decline signal, the ion beam controller 70 stores the position data obtained in the imaging cycle, in which the output decrease signal is received, as a decrease position, in which the output of ion beams is decreased. Also, the ion beam controller 70 stores the profile received from each output sensor in association with the position data obtained in imaging cycle, in which each profile is received.

When ion beam irradiation is performed on the substrate S transported in the reverse direction, the ion beam controller 70 outputs a drive instruction, which is received from the main controller 50, and an output instruction, which is based on the stored profile and position data, to the drive circuits 71D and 71D.

Each of the drive circuits 71D and 72D generates drive current of each ion source 21L and 21U based on the output instruction received from the ion beam controller 70 and outputs the drive current to the corresponding one of the ion sources 21L and 21U. In this manner, each ion source 21L and 21U outputs ion beams corresponding to the received drive current. This allows for the output of ion beams to be corrected based on the stored profile and position data. The irradiation of such ion beams is stopped when the position of the transport tray T relative to the imaging position reaches the output decline position.

This limits variations in the irradiation amount of ion beams over the plane of the substrate S even when the irradiation of ion beams decreases during transportation. The electrical configuration of the ion beam irradiation device 10 is not limited to the above configuration. As long as the ion beam irradiation device 10 is configured to correct the output of ion beams during the reverse transportation based on variations of the ion beam profile and the corresponding position of the transport tray, the same advantages may be obtained.

In the present embodiment of FIG. 3A and the modified example of FIG. 11, the barcode C1a is employed as an index to detect the position of the transport tray T. However, another index may be employed instead of the barcode. For example, a two-dimensional code such as a QR CODE (registered trademark) may be employed as an index. When a two-dimensional code is employed, not only position information, which indicates the position of the transport tray T, but also other information such as a product number of the substrate S are included in the two-dimensional code. Consequently, a variety of information may be obtained from the index.

The invention claimed is:

1. An ion beam irradiation device comprising:
   a vacuum chamber that accommodates a transport tray which holds a substrate;
   a transport unit that transports the transport tray along a transport line in the vacuum chamber in a transport direction;
   an ion beam irradiation unit that includes an ion source, wherein the ion source is fixed to the vacuum chamber to irradiate, with ion beams, an irradiation position that is defined in the vacuum chamber; and
   a position detector that is fixed to the vacuum chamber to detect a position of the transport tray,
   wherein the transport tray includes a plurality of indices, the plurality of indices being a plurality of barcodes that are located in the transport tray and arranged entirely from one end to the other end of the transport tray in the transport direction to indicate portions of the transport tray, and each of the plurality of barcodes being formed by bars that are each printed in a direction parallel to the transport direction,
   the position detector images each of the plurality of barcodes at a fixed imaging position, which is positioned in the vacuum chamber, when the transport tray reaches the imaging position during transportation of the transport tray and detects a position of the transport tray relative to the imaging position based on the imaged barcode, and
   the position detector and the ion source are located at opposite sides of the transport line.

2. The ion beam irradiation device according to claim 1, wherein the ion beam irradiation unit includes
   an output detector that detects an output of ion beams,
   an acquisition unit that acquires a detection result of the position detector and a detection result of the output detector in a predetermined cycle, and
   a memory unit that stores the detection result of the position detector and the detection result of the output detector that are obtained by the acquisition unit and associated with each other.

3. The ion beam irradiation device according to claim 2, wherein the output detector detects when the output of ion beams stops.

4. The ion beam irradiation device according to claim 3, wherein
   the transport unit transports the transport tray between a starting position of a transport process and a terminal position of the transport process,
   the ion beam irradiation device comprises a controller that controls transportation of the transport unit,
   the memory unit stores, as a stop position, the detection result of the position detector that is associated with the stop of the output of ion beams, and
   when the output detector detects the stop of the output of ion beams,
      the controller drives the transport unit so that the transport tray moves back and forth between the starting position and the terminal position, and the ion beam irradiation unit outputs ion beams, based on the stop position and the detection result of the position detector, to a portion of the substrate that has not been irradiated with ion beams.

5. The ion beam irradiation device according to claim 4, wherein
   when the output detector detects the stop of the output of ion beams,
      the controller transports the transport tray in the transport direction until the position of the transport tray relative to the imaging position reaches a non-irradiation position where the substrate is not irradiated with ion beams and then transports the transport tray, from the non-irradiation position, in a direction opposite to the transport direction, and
      the ion beam irradiation unit resumes ion beam irradiation when the position of the transport tray relative to the imaging position reaches the non-irradiation position, and stops the ion beam irradiation when the position of the transport tray relative to the imaging position reaches the stop position.

6. The ion beam irradiation device according to claim 1, wherein the position detector is located at a position that does not face the irradiation position of the ion source.

7. The ion beam irradiation device according to claim 1, wherein
   the irradiation position of the ion beam irradiation unit is divided, in an intersecting direction that intersects the transport direction, into a first irradiation position and a second irradiation position that contact each other, and
   the ion beam irradiation unit includes a first ion source that irradiates the first irradiation position with ion beams, and a second ion source that irradiates the second irradiation position with ion beams.

8. The ion beam irradiation device according to claim 7, wherein the transport tray includes two barcode groups, each formed by a plurality of barcodes, the two barcode groups are arranged so that the first irradiation position and the second irradiation position are located in between in the intersecting direction, the two barcode groups include
 a first barcode group located at a side of the first irradiation position, and
 a second barcode group located at a side of the second irradiation position, the position detector includes
 a first position detector arranged to image the first barcode group at a position facing the first barcode group, and
 a second position detector arranged to image the second barcode group at a position facing the second barcode group, the ion beam irradiation unit obtains a detection result of the second position detector during output from the first ion source, and the ion beam irradiation unit obtains a detection result of the first position detector during output from the second ion source.

9. The ion beam irradiation device according to claim 1, wherein the transport line includes an outgoing line and an incoming line that extend in the transport direction and are laid out parallel to each other, and the position detector includes
 an outgoing-line-side position detector fixed to the vacuum chamber in a vicinity of the outgoing line to image the plurality of barcodes when the transport tray is transported along the outgoing line, and
 an incoming-line-side position detector fixed to the vacuum chamber in a position between the outgoing line and the incoming line to image the plurality of barcodes when the transport tray is transported along the incoming line.

* * * * *